United States Patent
Zhou et al.

(10) Patent No.: US 8,524,527 B2
(45) Date of Patent: Sep. 3, 2013

(54) HIGH-PERFORMANCE SINGLE-CRYSTALLINE N-TYPE DOPANT-DOPED METAL OXIDE NANOWIRES FOR TRANSPARENT THIN FILM TRANSISTORS AND ACTIVE MATRIX ORGANIC LIGHT-EMITTING DIODE DISPLAYS

(75) Inventors: Chongwu Zhou, Arcadia, CA (US); PoChiang Chen, San Gabriel, CA (US)

(73) Assignee: University of Southern California, Los Angeles, CA (US)

( * ) Notice: Subject to any disclaimer, the term of this patent is extended or adjusted under 35 U.S.C. 154(b) by 292 days.

(21) Appl. No.: 12/891,764

(22) Filed: Sep. 27, 2010

(65) Prior Publication Data

US 2011/0073837 A1    Mar. 31, 2011

Related U.S. Application Data

(60) Provisional application No. 61/246,087, filed on Sep. 25, 2009.

(51) Int. Cl.
*H01L 21/00* (2006.01)
*H01L 21/16* (2006.01)

(52) U.S. Cl.
USPC ............ 438/104; 257/E21.461; 257/E33.013

(58) Field of Classification Search
USPC ................... 438/104; 257/E21.461, E33.013
See application file for complete search history.

(56) References Cited

U.S. PATENT DOCUMENTS 6,882,051 B2 * 4/2005 Majumdar et al. ............ 257/746
7,394,118 B2    7/2008 Zhou
7,662,652 B2    2/2010 Zhou
2002/0130311 A1 * 9/2002 Lieber et al. ................ 257/1

OTHER PUBLICATIONS

Akinwande et al., "Analysis of The Frequency Response of Carbon Nanotube Transistors," 2006, IEEE Transactions on Nanotechnology 5(5):599-605, 7 pages.
Asikanen et al., "Modifying ALE Grown In2O3 Films by Benzoly Fluoride Pulses," 1997, Applied Surface Science, 112:231-235, 5 pages.
Carcia et al., "Transparent ZnO Thin-Film Transistor Fabricated by RF Magnetron Sputtering," Feb. 17, 2003, Applied Physics Letters 82(7):1117-1119, 3 pages.

(Continued)

*Primary Examiner* — Stephen W Smoot
*Assistant Examiner* — Vicki B Booker
(74) *Attorney, Agent, or Firm* — Fish & Richardson P.C.

(57) ABSTRACT

Methods, materials, apparatus and systems are described for implementing high-performance arsenic (As)-doped indium oxide ($In_2O_3$) nanowires for transparent electronics, including their implementation in transparent thin-film transistors (TTFTs) and transparent active-matrix organic light-emitting diodes (AMOLED) displays. In one implementation, a method of fabricating n-type dopant-doped metal oxide nanowires includes dispersing nanoparticle catalysts on a $Si/SiO_2$ substrate. n-type dopant-doped metal oxide nanowires are grown on the $Si/SiO_2$ substrate using a laser ablation process. The laser ablation process can include: placing n-type dopant at an upper stream of a furnace; placing the $Si/SiO_2$ substrate at a down stream end of the furnace; heating the furnace; adding hydrogen to a carrier gas comprising argon and oxygen; flowing the hydrogen added carrier gas over the $Si/SiO_2$ substrate to suppress oxidation processes and incorporate the n-type dopant into the metal oxide nanowires; and cooling the n-type dopant-doped metal oxide nanowires grown on the $Si/SiO_2$ substrate.

3 Claims, 24 Drawing Sheets

(56) References Cited

OTHER PUBLICATIONS

Chae et al., "Patterning of Indium Tin Oxide by Projection Photoablation and Lift-off Process for Fabrication of Flat-Panel Displays," 2007, Applied Physics Letters 90: 261102-261104, 3 pages.
Chiang et al., "Thin-Film Transistors with Amorphous Indium Gallium Oxide Channel Layers," Nov.-Dec. 2006, Journal of Vacuum Science B 24(6):2702-2705, 4 pages.
Dattoli et al., "Fully Transparent Thin-Film Transistor Devices Based on SnO2 Nanowires," 2007, Nano Letters 7 (8):2463-2469, 7 pages.
DiBenedetto et al., "Molecular Self-Assembled Monolayers and Multilayers as Gate Dielectrics for Organic Thin Film Transistor Applications," 2009, Advanced Materials, 21, 1407-1433, 27 pages.
Duan et al., "Indium Phosphide Nanowires as Building Blocks for Nanoscale Electronic and Optoelectronic Devices," Jan. 4, 2001, Nature 409:66-69, 4 pages.
Fortunato et al., "Recent Advances in ZnO Transparent Thin Film Transistors," 2005, Thin Solid Films 487: 205-211, 7 pages.
Gruner, "Carbon Nanotube Films for Transparent and Plastic Electronics," 2006, Journal of Materials Chemistry, 16:3533-3539, 7 pages.
Hoffman et al., "ZnO-Based Transparent Thin-Film Transistors," Feb. 3, 2003, Applied Physics Letters 82 (3):733-735, 3 pages.
Huang et al., "Room-Temperature Ultraviolet Nanowire Nanolasers," 2001, Science, 392:1897-1899, 4 pages.
Inoue et al., "Electronic Structure of the Transparent P-Type Semiconductor (LaO)CuS," 2001, Physical Review B, 64, 245211-245215, 5 pages.
Ishikawa et al., "Transparent Electronics Based on Transfer Printed Aligned Carbon Nanotubes on Rigid and Flexible Substrates," 2009, ACS Nano, 3:73-79, 7 pages.
Ju et al., "Fabrication of Fully Transparent Nanowire Transistors for Transparent and Flexible Electronics," Jun. 2007, Nature Nanotechnology, 2:378-384, 7 pages.
Ju et al., "High Performance In2O3 Nanowire Transistors Using Organic Gate Nanodielectrics," 2008, Applied Physics Letters, 92:222105-222107, 3 pages.
Ju et al., "High-Performance ZnO Nanowire Field-Effect Transistors with Organic Nanodielectrics: Effects of Metal Contacts and Ozone Treatment," 2007, Nanotechnology, 2007, 18:155201-155211, 8 pages.
Ju et al., "Low Operating Voltage Single ZnO Nanowire Field-Effect Transistors Enabled by Self-Assembled Organic Gate Nanodielectrics," 2005, Nano Letters 2005, 5(11):2281-2286, 6 pages.
Ju et al., "Transparent Active Matrix Organic Light-Emitting Diode Displays Driven by Nanowire Transistor Circuitry," 2008, Nano Letters, 8:997-1004, 8 pages.
Kafafi et al., "Organic Electroluminescence," Taylor & Francis Group, 2005, Boca Raton, U.S.A.
Kawazoe et al., "P-type Electrical Conduction in Transparent Thin Films of CuAlO2," 1997, Nature, 389: 939-942, 4 pages.
Lee et al., "Effects of Heat Treatment and Ion Doping of Indium Oxide," 1989, Thin Solid Film, 173:59-66, 8 pages.
Li et al., "Diameter-Controlled Growth of Single-Crystalline In2O3 Nanowires and Their Electronic Properties," 2003, Advanced Materials, 15:143-146, 4 pages.
Nomura et al., "Thin-Film Transistor Fabricated in Single-Crystalline Transparent Oxide Semiconductor," 2003, Science, 300:1269-1272, 5 pages.
O'Regan et al., "A Low-Cost, High-Efficiency Solar-Cell Based on Dye-Sensitized Colloidal TiO2 Films," 1991, Nature, 353:737-740, 4 pages.
Philip et al., "Carrier-Controlled Ferromagnetism in Transparent Oxide Semiconductors," 2006, Nature Materials, 5:298-304, 7 pages.
Rogers et al., "Paper-like Electronic Displays: Large-Area Rubber-Stamped Plastic Sheets of Electronics and Microencapsulated Electrophoretic Inks," Apr. 24, 2001, Proceedings of the National Academy of Sciences of the United States of America, 98:4835-4840, 6 pages.
Samant et al., "Study of a Prototype High Quantum Efficiency Thick Scintillation Crystal Video-Electronic Portal Imaging Device," 2006, Medical Physics, 33: 2783-2791, 9 pages.
Soci et al., "ZnO Nanowire UV Photodetectors with High Internal Gain," 2007, Nano Letters, 7:1003-1009, 7 pages.
Tahar et al., "Tin Doped Indium Oxide Thin Films: Electrical Properties," 1998, Journal of Applied Physics, 83:2631-2645, 15 pages.
Ueda et al., "Epitaxial Growth of Transparent P-type Conducting CuGaO2 Thin Films on Sapphire (001) Substrates by Pulsed Laser Deposition," Feb. 1, 2001, Journal of Applied Physics, 89(3):1790-1793, 4 pages.
Wager et al., "Transparent Electronics," Springer Science + Business Media, LLC 2008, New York., U.S.A.
Wan et al., "Doping Dependent Electrical Characteristics of SnO2 Nanowires," 2008, Small 4(4):451-454, 4 pages.
Wang et al., "High-Performance Transparent Inorganic-Organic Hybrid Thin-Film N-Type Transistors," 2006, Nature Materials, 5:893-900, 9 pages.
Xiang et al., "Rational Synthesis of P-Type Zinc Oxide Nanowire Arrays Using Simple Chemical Vapor Deposition," 2007, Nano Letters 7(2):323-328, 6 pages.
Yoon et al., "Molecular Dielectric Multilayers for Low-Voltage Organic Thin-Film Transistors," 2005, Proceedings of the National Academy of Sciences, 102:4678-4682, 5 pages.
Zhang et al., "Electronic Transport Studies of Single-Crystalline In2O3 Nanowires," Jan. 6, 2003, Applied Physics Letters, 82(1):112-114, 3 pages.
Zheng et al., "Nanobelts of Semiconducting Oxides," 2001, Science, 291:1947-1949, 4 pages.
Zhang et al., "Single Zinc-Doped Indium Oxide Nanowire as Driving Transistor for Organic Light-Emitting Diode," 2008, Applied Physics Letters 2008, 92, 153312-153314, 3 pages.
Hirao et al., "High Mobility Top-gate Zinc Oxide Thin-Film Transistors (ZnO-TFTs) for Active-Matrix Liquid Crystal Displays," SID 06 Digit Digest 2006, 18-20.
Minami, T., "New N-Type Transparent Conducting Oxides," MRS Bulletin 2000, 25, pp. 38-44.

* cited by examiner

HIGH-PERFORMANCE SINGLE-CRYSTALLINE N-TYPE DOPANT-DOPED METAL OXIDE NANOWIRES FOR TRANSPARENT THIN FILM TRANSISTORS AND ACTIVE MATRIX ORGANIC LIGHT-EMITTING DIODE DISPLAYS

CLAIM OF PRIORITY

This application claims priority under 35 U.S.C. §119(e) to U.S. Provisional Patent Application No. 61/246,087 entitled: "High-Performance Single-Crystalline Arsenic-Doped Indium Oxide Nanowires for Transparent Thin Film Transistors" filed Sep. 25, 2009, the entire contents of which are incorporated by reference.

GOVERNMENT SUPPORT

This invention was made with government support under grant numbers CCF 0726815 and CCF 0702204 awarded by the National Science Foundation. The government has certain rights in the invention.

BACKGROUND

This application relates to transparent electronics.

Transparent electronics can be implemented in various applications, including displays,[2-5] solar cells,[6,7] charge-coupled devices (CCDS),[8] and UV detectors.[9,10] The core technology to realize the transparent electronics requires the development of high-performance transparent thin film transistors (TTFTs), with high device mobilities, moderate carrier concentrations, low threshold voltages, and steep subthreshold slopes.[11] Currently, TTFTs fabricated with amorphous or polycrystalline transparent conducting oxide (TCO) thin films have been widely studied, including ZnO, $SnO_2$, $CuAlO_2$ and many other semiconductor oxides.[1,12-16] However, TTFTs made from these materials usually exhibit rather low mobilities (0.2-120 $cm^2V^{-1}$ $sec^{-1}$) and high threshold voltages (Vth: 10-20 V).[14-17] For instance, TTFTs with amorphous indium gallium oxide (α-IGO) films display device mobility of 7 $cm^2V^{-1}$ $sec^{-1}$, a current on-off ratio of $10^4$, and an inverter gain of 1.5 on glass substrates.[18] These results clearly indicate that the performance of TCO thin film-based TTFTs may limit their operation in high frequency applications and has significant room for further improvement.

SUMMARY

Techniques, systems, apparatus materials are disclosed for implementing high-performance arsenic (As)-doped indium oxide ($In_2O_3$) nanowires for transparent electronics, including their implementation in transparent thin-film transistors (TTFTs) and transparent active-matrix organic light-emitting diodes (AMOLED) displays.

The subject matter described in this specification potentially can provide one or more of the following advantages. With the aid of n-type dopants, such as arsenic, zinc and antimony, and a self-assembled gate nanodielectric, As-doped $In_2O_3$ nanowire TTFTs with transparent ITO contacts show good transparency and excellent transistor performance such as high mobility, high on/off ratio, low operation voltage, and steep subthreshold slope. A saturation device mobility of 1,490 $cm^2V^{-1}s^{-1}$ can be achieved on glass substrates, which is the highest TTFT device mobility reported so far. We further examined the AC gain from a single As-doped $In_2O_3$ nanowire TTFT, and the results indicate good frequency response and a unity-gain frequency of 18.8 GHz. In addition, the TTFTs were further utilized to construct a transparent circuit and used to control a variable-intensity OLED. Moreover, an AMOLED display with good transparency was also fabricated which generates numerical displays. Results suggest that As-doped $In_2O_3$ nanowires have great potential to serve as building blocks for future transparent electronics.

BRIEF DESCRIPTION OF THE DRAWINGS

Like reference symbols and designations in the various drawings indicate like elements.

DETAILED DESCRIPTION

Figure 1A:
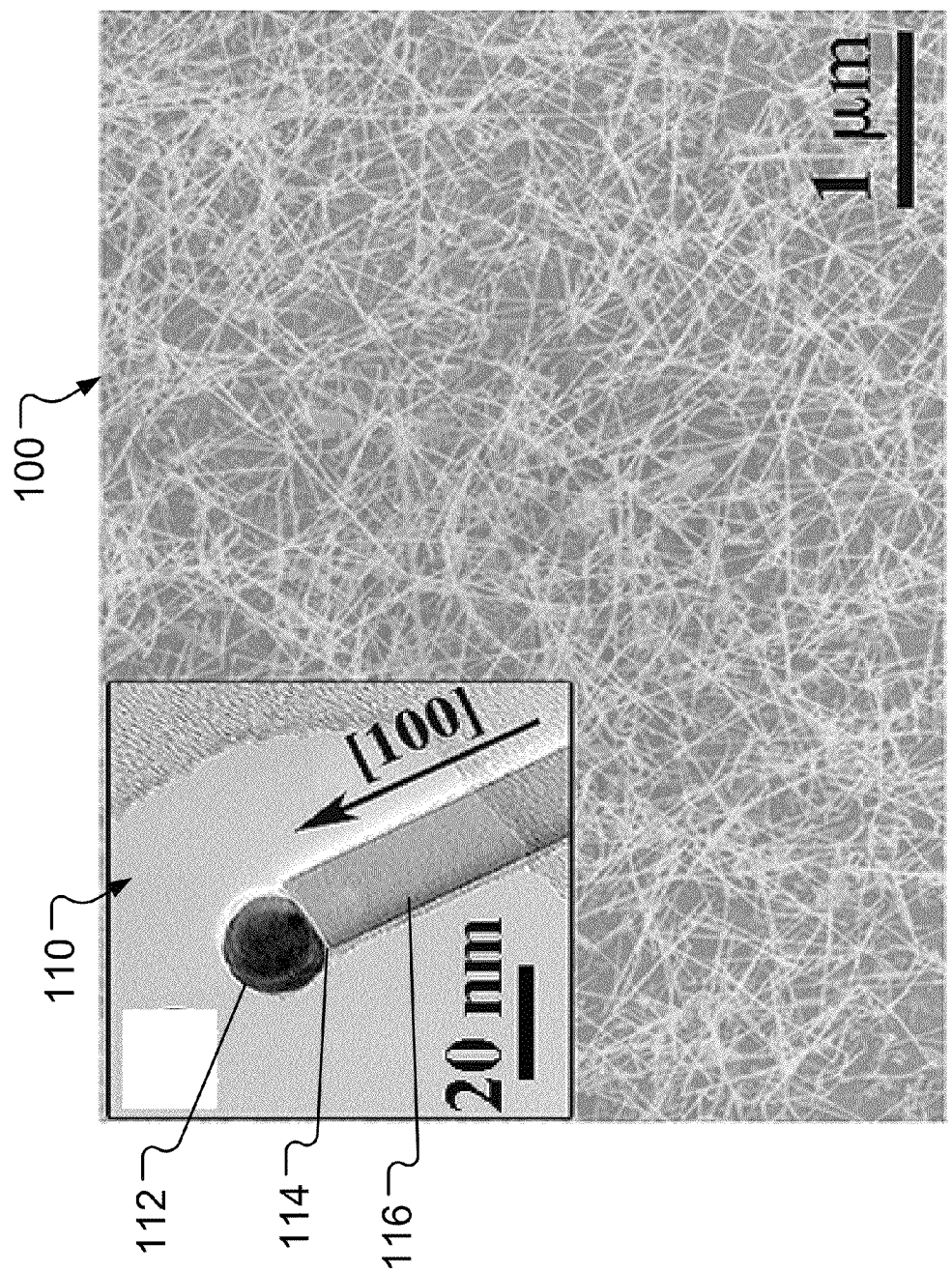
FIG. 1a shows an SEM image of As-doped indium oxide nanowires.

Transparent electronics or invisible circuits can provide optical transparency and low temperature processing. As such, transparent electronics can be used in various applications including displays, solar cells, charge-coupled devices (CCDS), and ultraviolet (UV) detectors. High-performance transparent thin film transistors (TTFTs) with high device mobilities, moderate carrier concentrations, low threshold voltages, and steep subthreshold slopes can be used to implement the transparent electronics. TTFTs can be fabricated with amorphous or polycrystalline transparent conducting oxide (TCO) thin films, including ZnO, $SnO_2$, $CuAlO_2$ and many other semiconductor oxides. However, TTFTs made from these materials usually exhibit rather low mobilities (e.g., 0.2-120 $cm^2V^{-1}$ $sec^{-1}$) and high threshold voltages (e.g., $V_{th}$: 10-20 V). For instance, TTFTs with amorphous indium gallium oxide ($\alpha$-IGO) films display device mobility of 7 $cm^2V^{-1}$ $sec^{-1}$, a current on-off ratio of $10^4$, and an inverter gain of 1.5 on glass substrates. Based on these results, TCO thin film-based TTFTs may have limited use in high frequency applications.

Additionally, one-dimensional (1-D) nanostructured materials, including single-walled carbon nanotubes (SWNTs) and semiconductor metal oxide nanowires can be used for TTFT fabrications. In comparison to conventional TCO-based TTFTs, nanomaterials synthesized through a simple chemical vapor deposition (CVD) method can easily provide high-quality single-crystalline nanostructures, which are highly desirable in most electronic and optoelectronic devices. In addition, nanostructured material-based TTFTs can provide added advantages, such as versatile compatibility with a variety of device substrates, which can extend their applicability to flexible electronics, due to the compatibility of nanostructured TTFTs with low temperature processing. Among these nanomaterials, $In_2O_3$ nanowires having a wide energy gap (~3.75 eV), a single crystalline nanostructure, and high device mobility may be one of the best candidates for high performance TTFTs. For example, $1n_2O_3$ nanowire TTFTs with a device mobility as high as 514 $cm^2V^{-1}$ $sec^{-1}$ can be implemented. Further improvement in performance may be achieved through doping of the nanowires.

For display implementation, having good optical transparency and/or mechanical flexibility, high performance transparent and/or flexible TFTs can be useful. For example, the circuitry of an active matrix organic light-emitting diode (AMOLED) pixel usually contains one driving transistor and one switching transistor. The driving transistors need to carry sufficient current to the OLED pixels, and the switching transistors should be capable of operating at 60-120 Hz for the human eye to see an integrated image of successively presented patterns in a video display (so-called retinal persistence). Polycrystalline silicon (poly-Si) and amorphous silicon ($\alpha$-Si) can be used as the "back-panel" electronics for AMOLED displays. However, these poly-Si and $\alpha$-Si back-panels are generally optically opaque, not compatible with flexible substrates, and can have low mobilities, high threshold voltages, and in the case of $\alpha$-Si, poor current-carrying capacity.

Described below are synthesis of arsenic (As)-doped $In_2O_3$ nanowires on $Si/SiO_2$ substrates; fabrication of TTFTs by transferring the doped nanowires to glass substrates with pre-patterned indium-tin oxide (ITO) gate electrodes and an $Al_2O_3$ or a self-assembled nanodielectric (SAND) gate insulator; and patterning of transparent ITO source and drain electrodes. The as-fabricated As-doped $In_2O_3$ nanowire TTFTs perform as typical n-type FETs with a high device mobility (e.g., 1,490 $cm^2V^{-1}$ $sec^{-1}$) and optical transparency of near 81% in the visible wavelength regime. Also described is the AC gain of these nanowire TTFTs. The results indicate good frequency response, ~1.5 kHz with a unity-gain frequency of ~18.8 GHz. Moreover, As-doped $In_2O_3$ nanowire TTFTs can be used to drive organic light-emitting diodes (OLEDs) with tunable emitting intensities, including a seven-segment AMOLED display enabled by a nanowire TTFT "back-panel."

Techniques, systems, apparatus and materials are described for implementing high-performance arsenic (As)-doped indium oxide ($In_2O_3$) nanowires for transparent electronics, including their implementation in transparent thin-film transistors (TTFTs) and transparent active-matrix organic light-emitting diodes (AMOLED) displays. The As-doped $In_2O_3$ nanowires can be synthesized using a laser ablation process, and then fabricated into TTFTs with indium-tin-oxide (ITO) as the source, drain and gate electrodes. The nanowire TTFTs on glass substrates exhibit very high device mobilities (e.g., ~1,490 $cm^2V^1s^{-1}$), current on/off ratios (e.g., $5.7\times10^6$), steep subthreshold slopes (e.g., 88 mY/dec), and a saturation current of 60 µA for a single nanowire. By using a self-assembled nanodielectric (SAND) as gate dielectric, the device mobilities and saturation current can be further improved up to 2,560 $cm^2V^{-1}s^{-1}$ and 160 µA, respectively. All devices exhibit good optical transparency (e.g., ~81% on average) in the visible spectral range. In addition, the nanowire TTFTs can be utilized to control green OLEDs with varied intensities. Furthermore, a fully integrated seven-segment AMOLED display was fabricated with a good transparency of 40% and with each pixel controlled by two nanowire transistors. As described below, performance enhancement can be achieved by combining nanowire doping and self-assembled nanodielectrics to implement silicon-free electronic circuitry for low power consumption, optically transparent, high-frequency devices assembled near room temperature.

Characterizations of Arsenic-Doped Indium Oxide Nanowires

As-doped $In_2O_3$ nanowires can be grown on a $Si/SiO_2$ substrate by a laser ablation process. Using argon mixed with oxygen as the carrier gas, hydrogen can be added to the carrying gas to suppress the oxidation processes and incorporate a small amount of As into the $In_2O_3$ nanowires. The surface morphology and crystal structure of the As-doped $In_2O_3$ nanowires can be further characterized by field-emission scanning electron microscopy (FESEM), high-resolution transmission electron microscopy (HRTEM), selected area electron diffraction pattern (SAED), and energy dispersion X-ray spectrometry (EDS).

Figure 1B:
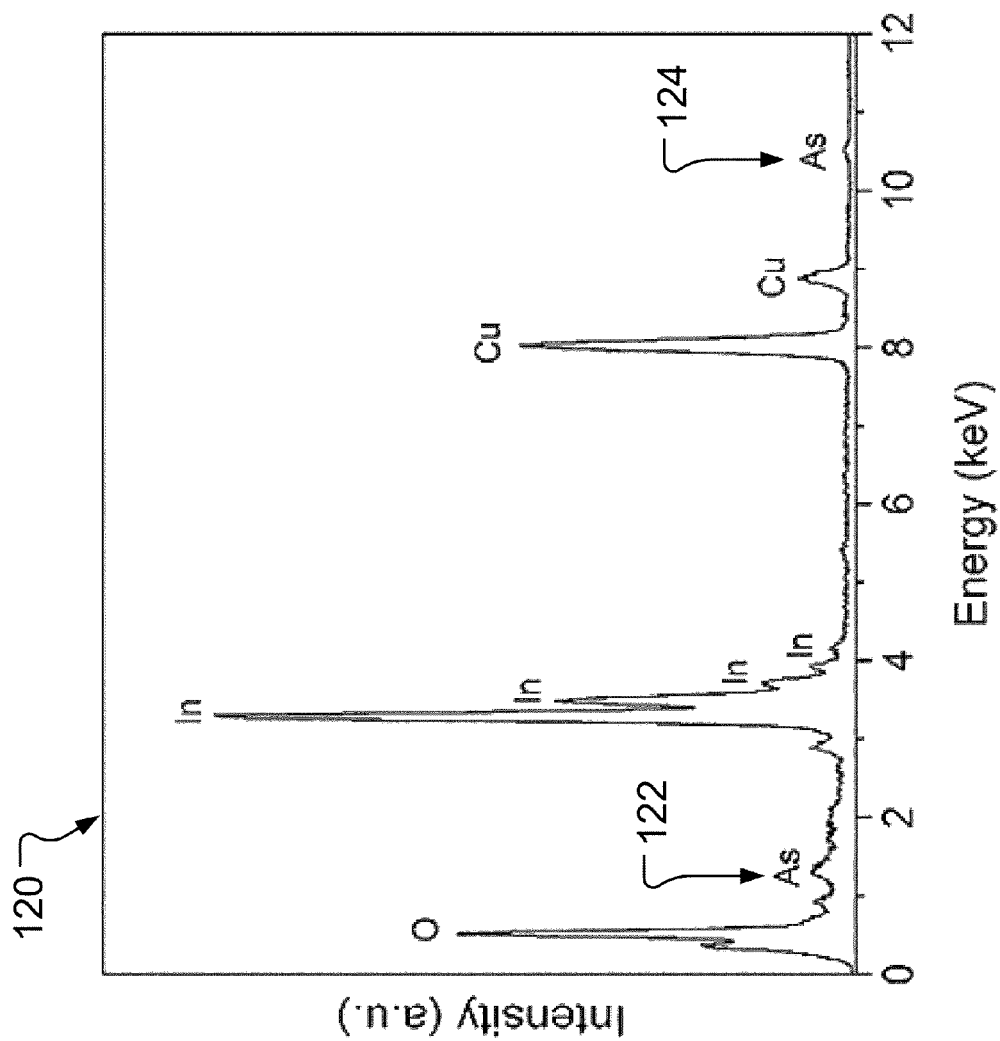
FIG. 1b shows EDS spectrum showing the chemical composition of the As-doped indium oxide nanowires.

FIG. 1a shows a typical SEM image 100 of as-grown As-doped $In_2O_3$ nanowires which are ~5-10 µm long with a diameter of 15-30 nm. In the inset 110 of the SEM image 100, an Au/In alloy particle 112, with a diameter of ~16 nm, can be clearly observed at the very tip 114 of a nanowire 116, supporting growth via a so-called vapor-liquid-solid (VLS) growth mechanism. In addition, the As-doped $In_2O_3$ nanowires have perfectly smooth surfaces without any amorphous coating and have extremely uniform diameters. To further evaluate the composition of the As-doped $In_2O_3$ nanowires, (EDS) can be performed during a (TEM) investigation. FIG. 1b shows a typical EDS spectrum 120 of an individual As-doped $In_2O_3$ nanowire, which indicates the presence of As elements 122 and 124 in $In_2O_3$ nanowires. The atomic ratio of In:As can be estimated as 100:4. The atomic density of indium atoms in $In_2O_3$ is about $3.12\times10^{22}$ atom/cm$^3$, and the dopant density of 4% As dopants can be estimated to be $1.25\times10^{21}$ atom/cm$^3$.

Figure 1C:
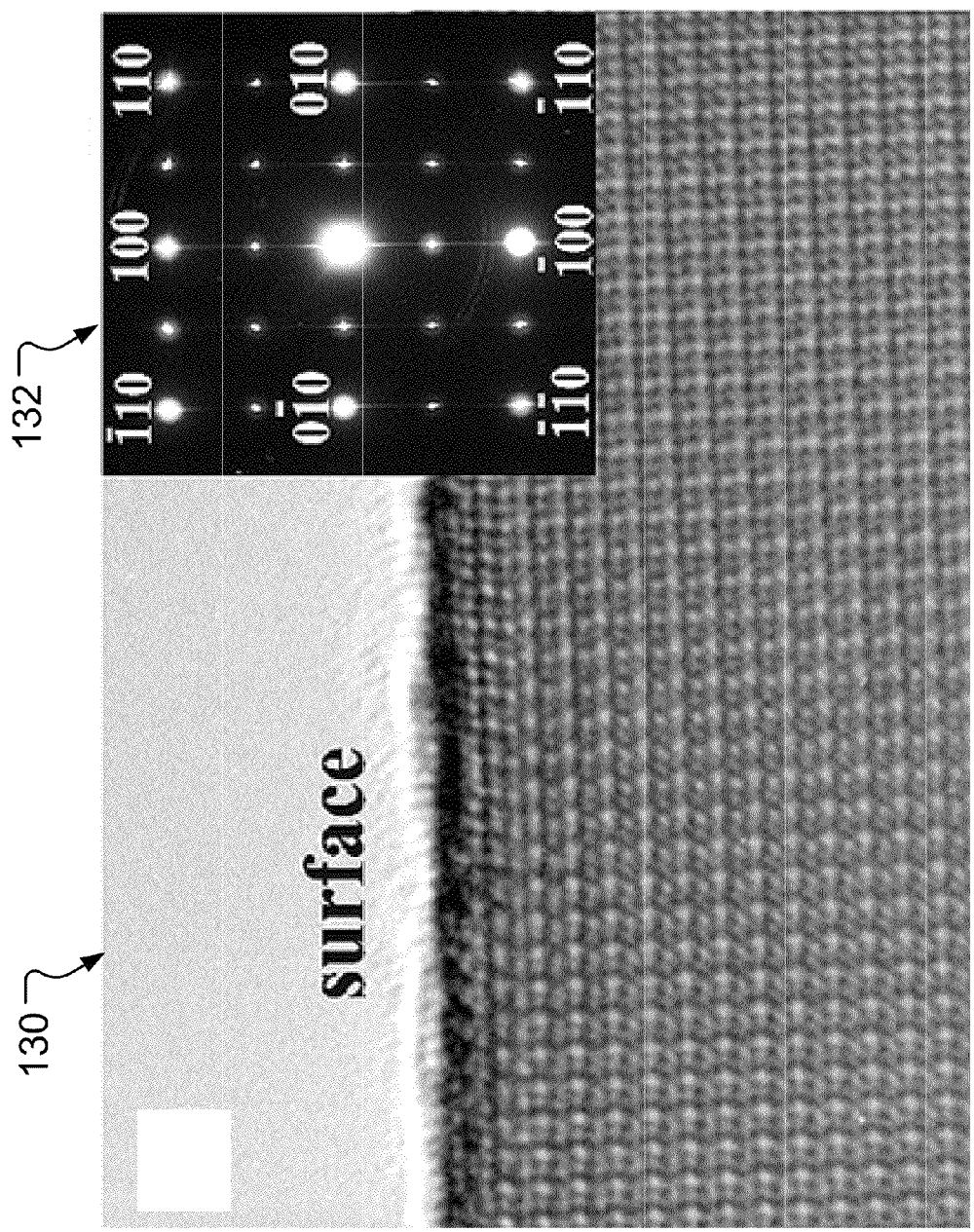
FIG. 1c shows corresponding HR-TEM image of a single As-doped $In_2O_3$ nanowire with a diameter of ~16 nm.
Figure 1D:
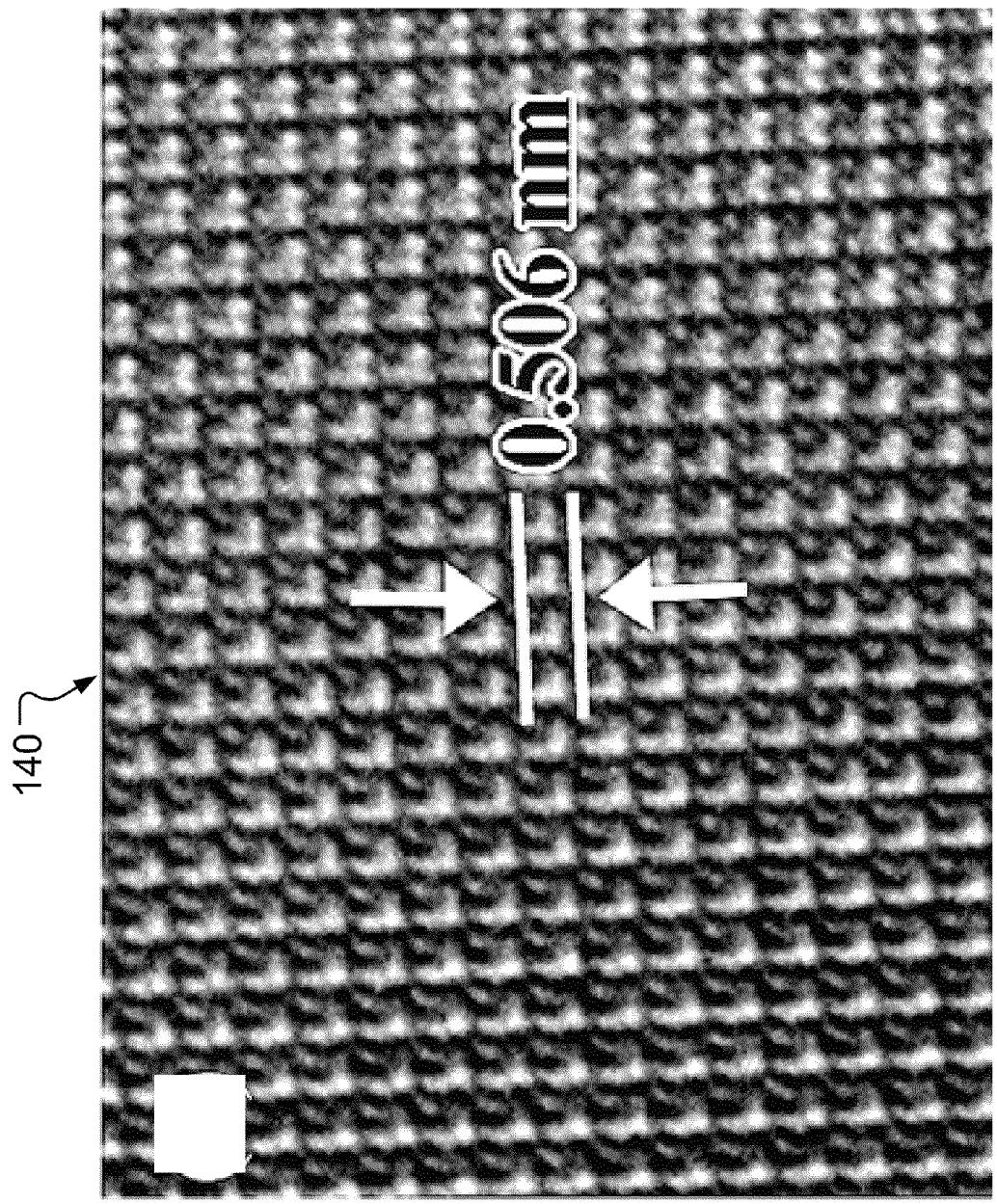
FIG. 1d shows another HR-TEM image, where the (100) planes are clearly visible, and oriented perpendicular to the vertical axis.

Also, the crystallography of these As-doped nanowires can be studied using HRTEM (SAED). HRTEM (see image 130) confirms that each As-doped $In_2O_3$ nanowire has a perfect single crystalline structure without any noticeable dislocations or defects, and the corresponding SAED (see image 132 in the inset) reveals that the phase of As-doped nanowires is body-centered cubic (bcc), as shown in FIG. 1c. The interspacing between each plane is 0.506 nm, corresponding to the (200) plane in the bcc As-doped $In_2O_3$ nanowire crystal structure as shown in the image 140 of FIG. 1d, with the lattice constant ($\alpha$) of 1.012 nm slightly expanded versus that of un-doped $In_2O_3$ nanowires ($\alpha$=1.01 nm). The expanded lattice constant can be attributed to the incorporation of As into the $In_2O_3$ nanowires. Taken together, these results indicate that these nanowires grown using the present laser ablation process exhibit high crystalline quality, with the $In_2O_3$ nanowire structural integrity preserved after As dopant incorporation.

Electronic Transport Characteristics of As-doped $In_2O_3$ Nanowire TTFTs

Figure 2A:
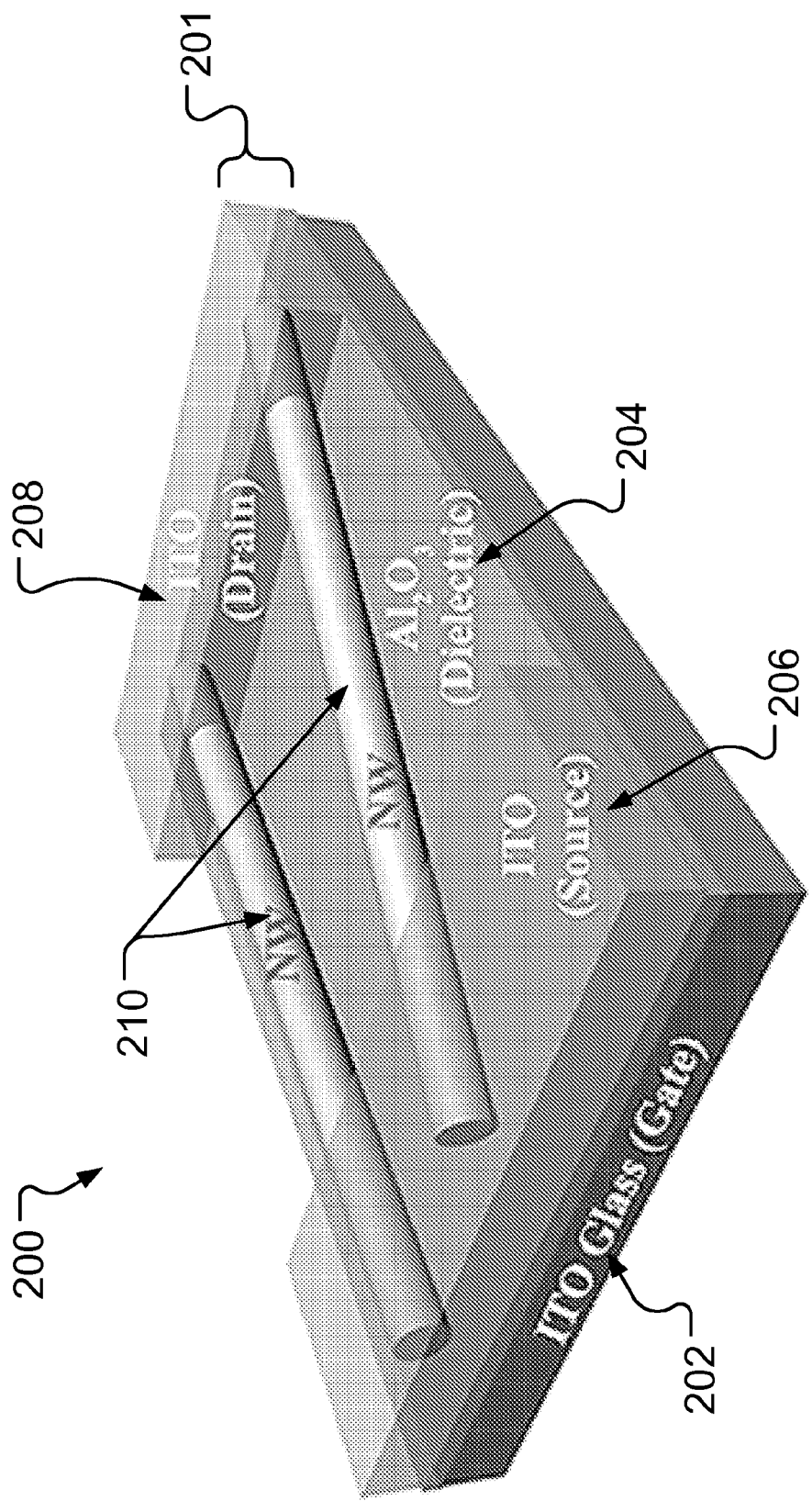
FIG. 2a shows Schematic diagram of As-doped $In_2O_3$ nanowire TTFT fabricated on an ITO glass substrate, with ALD-deposited $Al_2O_3$ or SAND as the dielectric layer and IAD-deposited ITO as source and drain electrodes.

Doping processes can substantially enhance the electrical properties of nanowire materials in a controlled fashion, and zinc, antimony and arsenic are all effective n-type dopants which increase the carrier concentration in $In_2O_3$ thin films. For illustrative purposes, described below are As-doped $In_2O_3$ nanowires used as the semiconductor in TTFT devices. After the nanowire synthesis, the as-grown nanowires are removed from the $Si/SiO_2$ substrates by ultra-sonication to yield a suspension in isopropyl alcohol (IPA), and are dispersed onto an ITO substrate with 50 nm $Al_2O_3$ dielectric. The process can be performed repeatedly until the desired nanowire density is achieved and then ITO can be deposited as source and drain electrodes. The nanowire orientation can be random, but the desired density and a yield of at least 80% can be achieved for the transistors. FIG. 2a shows a schematic 200 of an As-doped $In_2O_3$ nanowire TTFT 201 on an ITO glass substrate 202, with an atomic layer deposition (ALD)-derived high-k $Al_2O_3$ (thickness of 50 nm, $k_{eff}$~9.0) dielectric layer 204, and ion-assisted deposition-derived (IAD) ITO (thickness of 100 nm, sheet resistance ~60Ω/□) source 206 and drain 208 electrodes, with the semiconductor-doped metal oxide nanowires 210 as the active channel. Details can be found below.

Figure 2B:
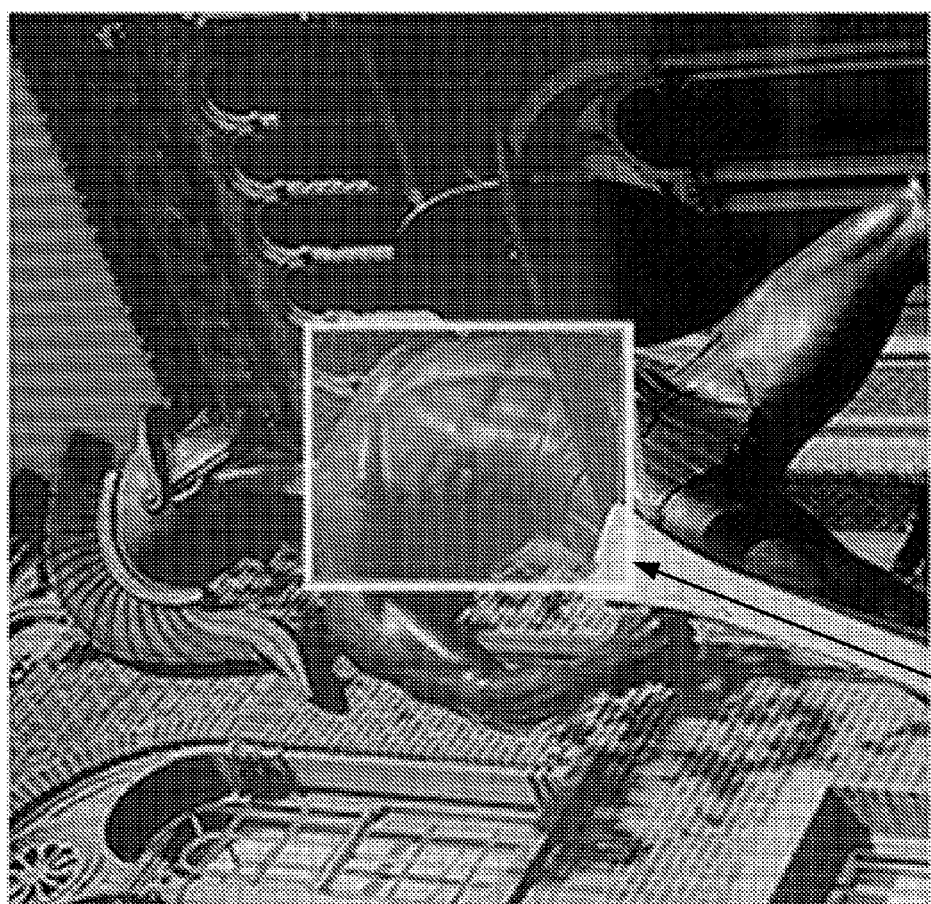
FIG. 2b shows Optical photograph of fully transparent As-doped $In_2O_3$ nanowire transistors.

FIG. 2b displays an optical image of 220 an As-doped $In_2O_3$ nanowire TTFT substrate, with the background photograph 222 visible through the transistor regions. The transmittance spectrum in FIG. 7 below reveals ~81% optical transmission, essentially identical to that of bare glass or glass/ITO substrates.

Figure 2C:
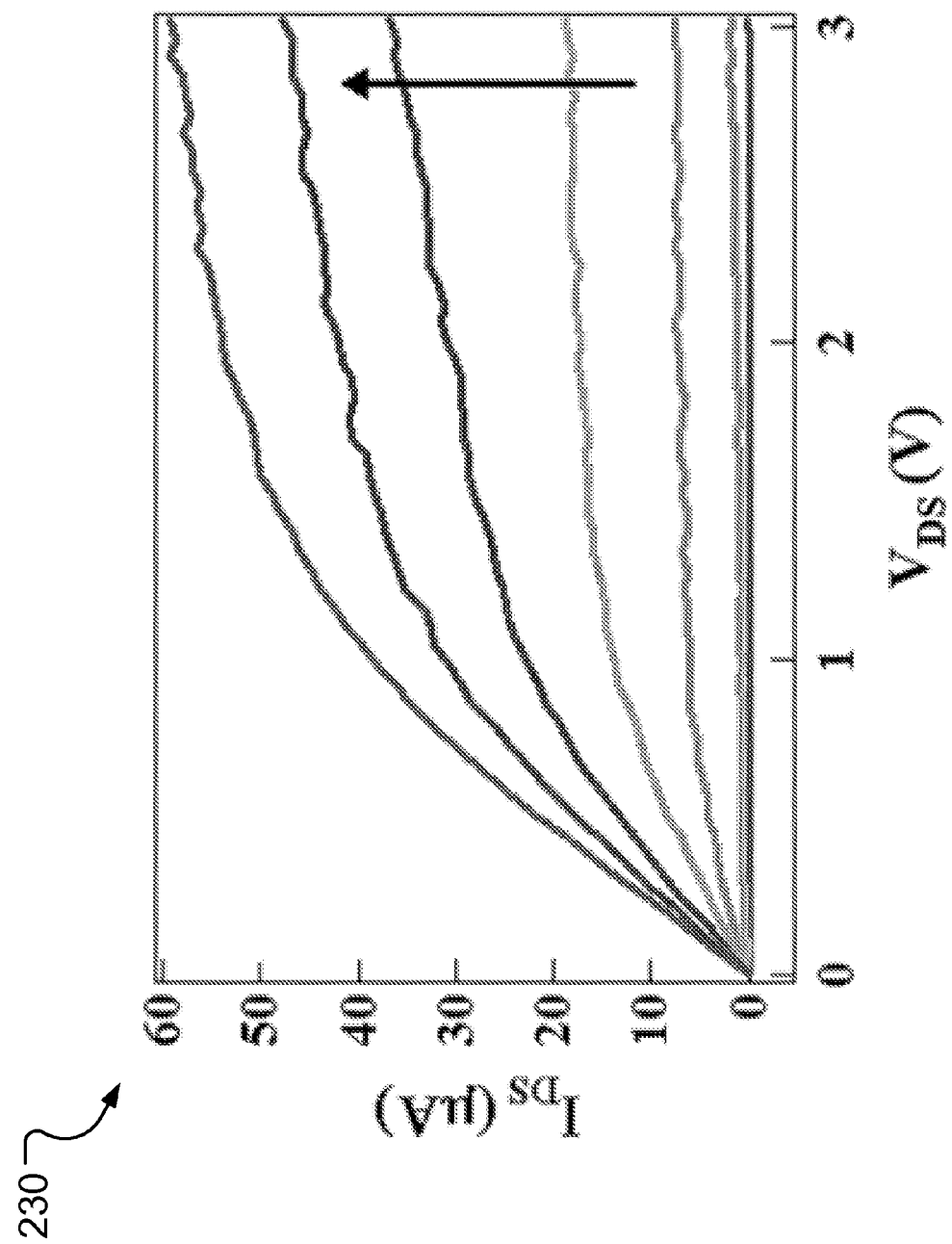
FIG. 2c exhibits Family of $I_{ds}$-$V_{DS}$ curves of a single As-doped $In_2O_3$ nanowire TTFT with the channel length of 1.8 μm.

Detailed electronic transport measurements can be carried out to characterize the electronic properties of single As-doped $In_2O_3$ nanowire TTFTs. FIG. 2c is a chart 230 of the measured drain current ($I_{ds}$) versus source-drain voltage ($V_{DS}$) characteristics of a representative single nanowire TTFT. The channel length of the as-fabricated TTFTs is ~1.8 μm, shown in the inset SEM image 242 of FIG. 2d (scale bar=1 μm). The device exhibits typical enhancement-mode n-type semiconductor transistor behavior with an on-current ($I_{on}$) of ~60 μA. while $V_g$=4.5 V and $V_{DS}$=3V. Note that doping helps to reduce the contact resistance in $In_2O_3$ nanowire FETs, shown by the absence of a Schottky barrier in FIG. 2c.

Figure 2D:
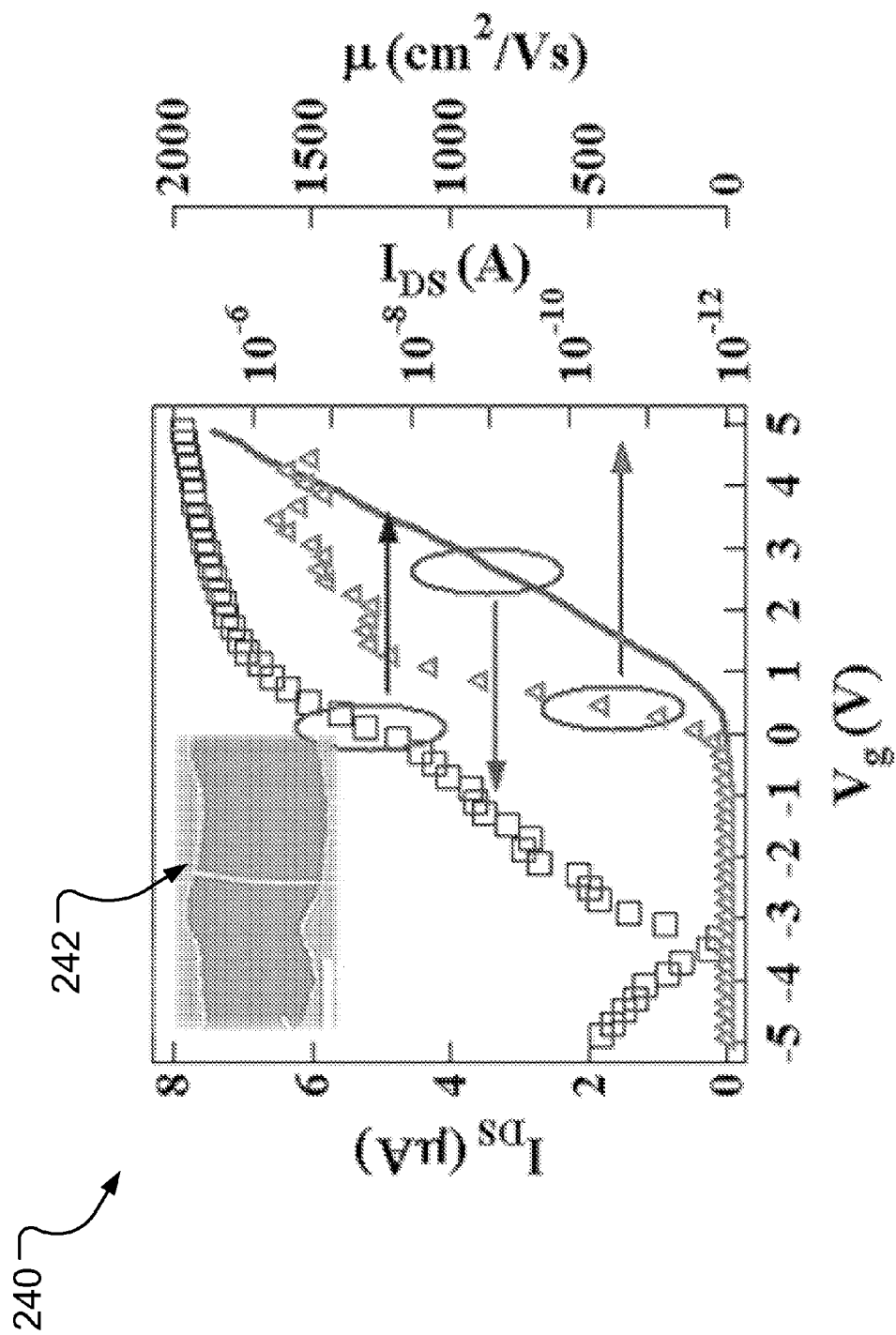
FIG. 2d shows Current versus gate voltage ($I_{ds}$-$V_g$) plot in the linear regime ($V_{DS}$=200 mV).

FIG. 2d is a chart 240 that shows the drain current ($I_{ds}$) versus gate voltage ($V_g$) characteristics for a single transparent As-doped $In_2O_3$ nanowire transistor. The doped $In_2O_3$ nanowire devices display $I_{on}/I_{off}$=5.7×10$^6$, a peak subthreshold slope (S)=88 mV/dec, and threshold voltage ($V_T$)=0.5 V, while $V_{DS}$=200 mV. The mobility ($\mu$) can be calculated from the maximum transconductance by applying the equations 1 and 2.

$$\text{device mobility}(\mu) = \frac{L^2}{V_{DS}C_i} \cdot \frac{dI_{DS}}{dV_g} \quad (1)$$

where L is the channel length and $C_i$ is the specific capacitance of single doped nanowire calculated as follows, $$C_i = 2\pi\epsilon_0\epsilon_s L/\ln(2h/r) \quad (2)$$

where, r is the radius of doped $In_2O_3$ nanowires, h is the thickness of the dielectric layer, and $\epsilon_s$ is the dielectric constant of ALD deposited $Al_2O_3$. The device mobility can vary from ~1,080-1,490 cm$^2$V$^{-1}$ sec$^{-1}$ as the gate bias is increased from 1.0 V to 3.0 V. In comparisons to other nanowire TFTs, the present mobilities are substantially greater, with ZnO=20 cm$^2$V$^{-1}$ sec$^{-1}$, $In_2O_3$=35 cm$^2$V$^{-1}$ sec$^{-1}$, and $SnO_2$=15 cm$^2$V$^{-1}$ sec$^{-1}$. This can be understood from the single-crystal nature of the As-doped $In_2O_3$ nanowires and the formation of relatively high-quality interfaces. Note that the present device performance rivals or exceeds that of previously reported doped and un-doped metal oxide nanowire TTFTs. Table 1 summarizes the relevant data which suggest that the As doping should significantly enhance overall nanowire device performance.

TABLE 1

| Material | On-Current (μA) | Mobility (cm$^2$/VS) | On/off ratio | Subthreshold Slope (mV/dec) |
|---|---|---|---|---|
| $In_2O_3$ NW | <1 | 98.1 | 2 × 10$^4$ | N/A |
| $In_2O_3$ NW | 10 | 514 | 10$^6$ | 160 |
| $In_2O_3$ Thin film | 800 | 120 | 10$^5$ | 80 |
| ZnO | 2 | 96 | 10$^6$ | 300 |
| Ta-$SnO_2$ NW | 20 | 120 | 10$^5$ | 270 |
| Sb-$In_2O_3$ NW | 22 | 550 | 10$^5$ | 170 |
| Zn-$In_2O_3$ NW | 8.5 | 80 | 10$^6$ | 700 |
| As-$In_2O_3$ NW | 60 | 1,490 | 5.7 × 10$^6$ | 88 |

Detailed statistical study of ten single nanowire TTFTs (see FIGS. 6a, 6b and 6c below) reveals that the device mobility is 1,200 cm$^2$V$^{-1}$ sec$^{-1}$ in average with a standard deviation of 210 cm$^2$V$^{-1}$ sec$^{-1}$ the subthreshold voltage is 170 mV/dec with a standard deviation of 90 mV/dec, and the $I_{on}/I_{off}$ ratio is from 10$^5$ to 10$^7$.

To further modify device performance, the 50 nm $Al_2O_3$ gate dielectric can be replaced with an organic self-assembled nanodielectric (SAND), layer (thickness ~16 nm, $k_{eff}$~5; see below for details). The mobility of a single As-doped $In_2O_3$ nanowire TFT is enhanced to ~2,560 cm$^2$V$^{-1}$ sec$^{-1}$, for $V_g$ and $V_{DS}$=4.4 V and 200 mV, respectively. In addition, $I_{on}$ is increased to 160 μA at Vg=3.0 V and $V_{DS}$=1.5 V, and S increased to 149 mV/dec (see FIGS. 5a and 5b below). These SAND effects can be attributed to: the advantageous characteristics of the high-capacitance dipolar organic nanoscopic dielectrics. Similar $I_{on}/I_{off}$ ratio (~10$^4$) was previously reported for ZnO/SAND nanowire TFTs, and may result from the gate leakage current. The gate leakage current was measured between the source/drain pads and the back gate electrode (with overlapping area of ~2×10$^5$ µm$^2$) to be about 1 nA for the 16 nm SAND dielectric and 20 pA for the 50 nm Al$_2$O$_3$ dielectric at $V_g$=3 V. This gate leakage current for SAND dielectric sets a lower limit for the off current that can be reliably measured, and may be a reason for the observed $I_{on}/I_{off}$ ratio of 10$^4$ for the SAND-gated devices. Much of the measured leakage current may be conduction between the source/drain pads and the back gate electrode underneath, and thus the leakage current could be greatly reduced by using a patterned gate electrode with minimized overlap with the source and drain electrodes.

The present devices exhibit high mobilities and steep sub-threshold slopes, which are desired properties for fast device operation, such as switching transistors in AMOLED displays. The unity-gain frequency of the nanowire TTFTs can be estimated using equation 3, where ($V_g$-$V_T$) is the gate overvoltage (the applied gate voltage in excess of the threshold voltage).

$$f_T = \frac{\mu(V_g - V_T)}{2\pi L^2} \quad (3)$$

Figure 2E:
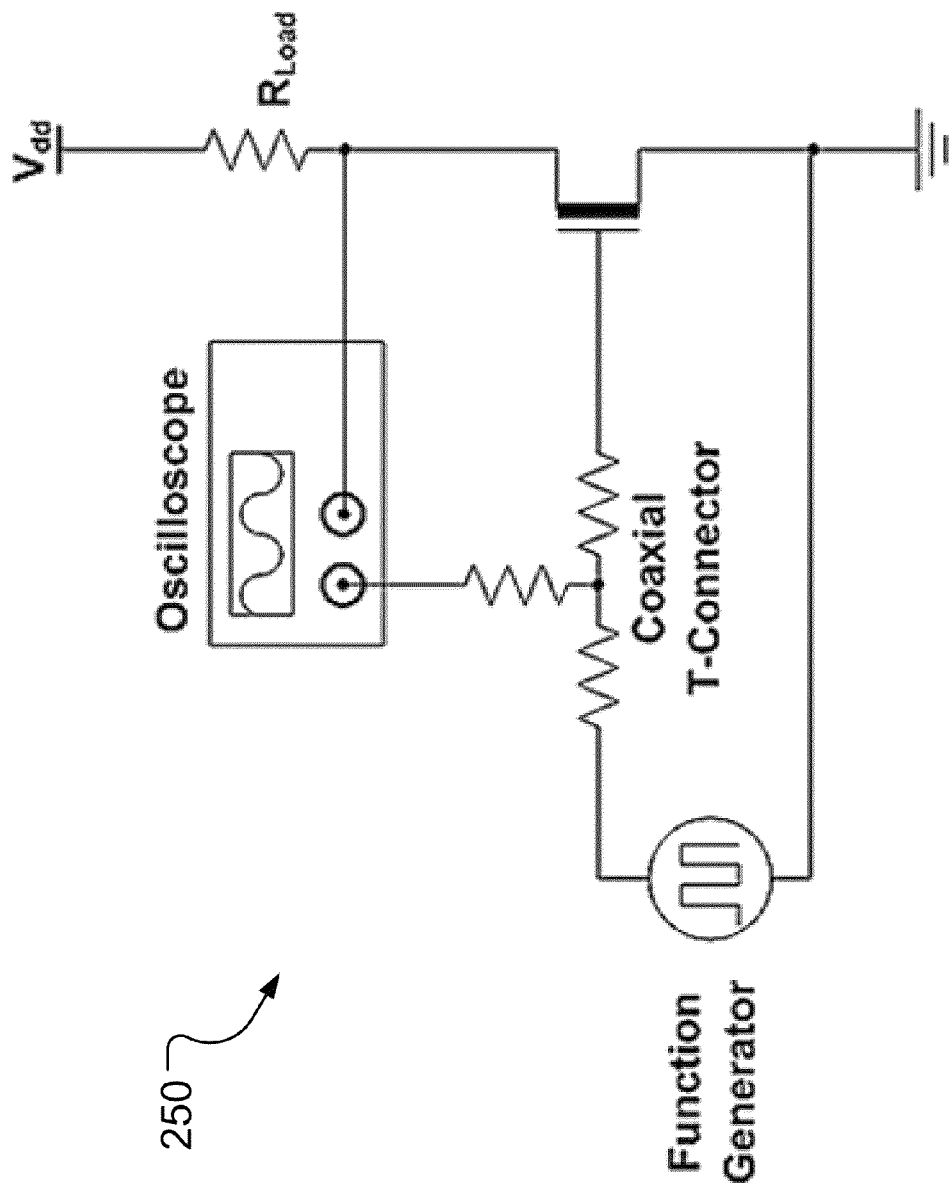
FIG. 2e shows the measurement setup showing As-doped $In_2O_3$ nanowire transistor configured as a common-source amplifier.

In this approximation, the unity-gain frequency of the described TTFTs can reach 18.8 GHz. In addition, the AC gain and radio-frequency response (RFR) can be described from the As-doped In$_2$O$_3$ nanowire TTFTs. FIG. 2e is a diagram 250 that shows an experimental set-up for AC measurements. The nanowire TTFT is configured as common-source amplifier, and DC offsets are applied to the gate and drain electrodes to bias it in saturation, near the maximum $g_m$ (~1.8 µS).

Figure 2F:
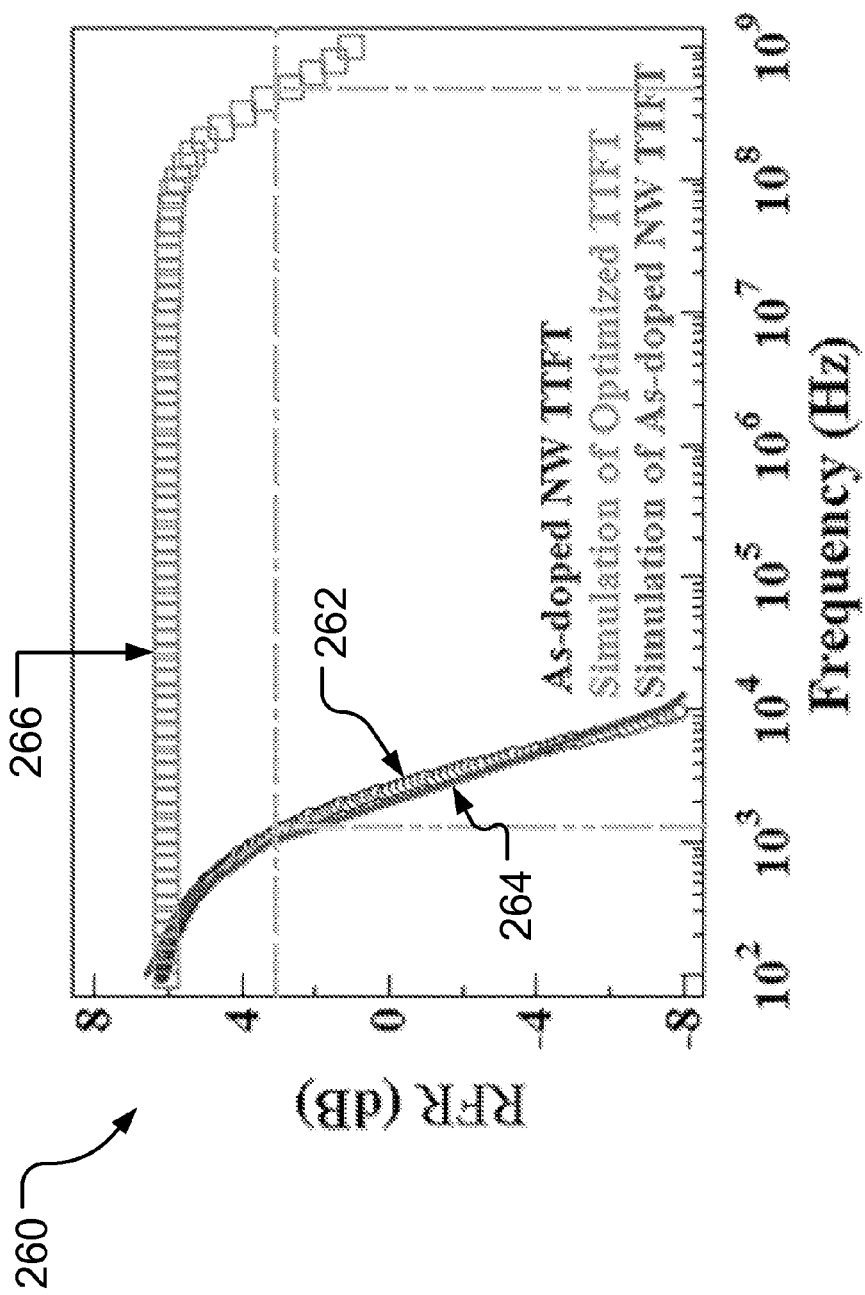
FIG. 2f shows the frequency response of AC gain of As-doped $In_2O_3$ nanowire TTFT.
Figure 2G:
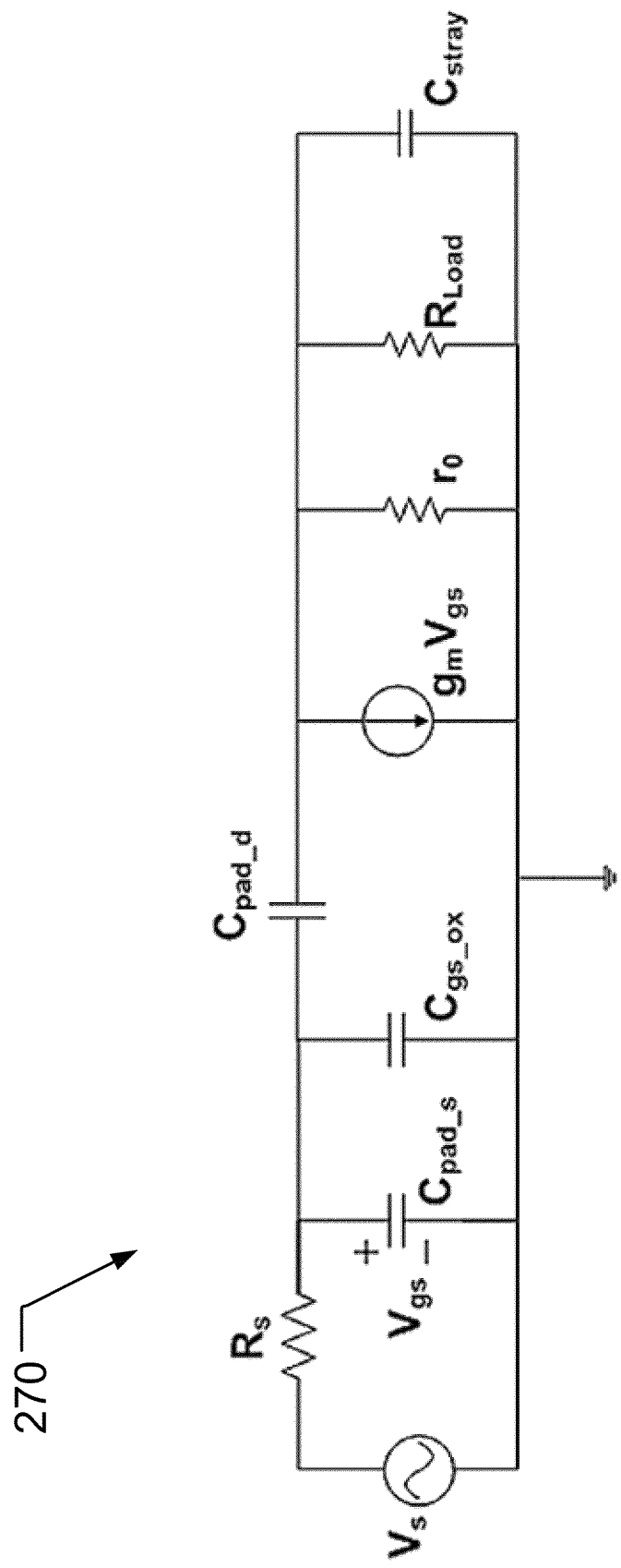
FIG. 2g shows the bilateral small-signal model used in the patent.

FIG. 2f is a plot 260 that shows the RFR of the device measured by applying digital signal processing (DSP) to the time domain signals (262—open circles), simulated data for the as-fabricated TTFT (264—closed circles), and simulated data for an optimized device structure (266—open boxes). A gain of ~6 dB can be observed at low frequency with a roll-off around 500 Hz and a cut-off frequency ($f_{-3\ dB}$) of ~1.5 kHz, which is comparable to earlier work. To understand the frequency response of the described As-doped In$_2$O$_3$ nanowire TTFTs, a bilateral small-signal model 270 (shown in FIG. 2g) can be applied to model the AC characteristics of the present TTFTs. The simulated result (264—closed circles in FIG. 2f) agrees well with the measured data, suggesting that the operation frequency is strongly influenced by the parasitic capacitance associated with the source and drain contact electrodes (~157 pF) and the probes (~100 pF). By optimizing the device dimensions and structure (i.e., use short channel widths and reduce overlaps between source and drain contact electrodes), and adopting an active probe (~1 MΩ) for the measurements, the cut-off frequency ($f_{-3\ dB}$) can be increased to 400 MHz, shown in the FIG. 2f (266—open boxes). The simulated results therefore suggest that As-doped In$_2$O$_3$ nanowire TTFTs can offer great potential in high frequency device applications.

Fully Transparent OLED Driving Circuitry

Figure 3A:
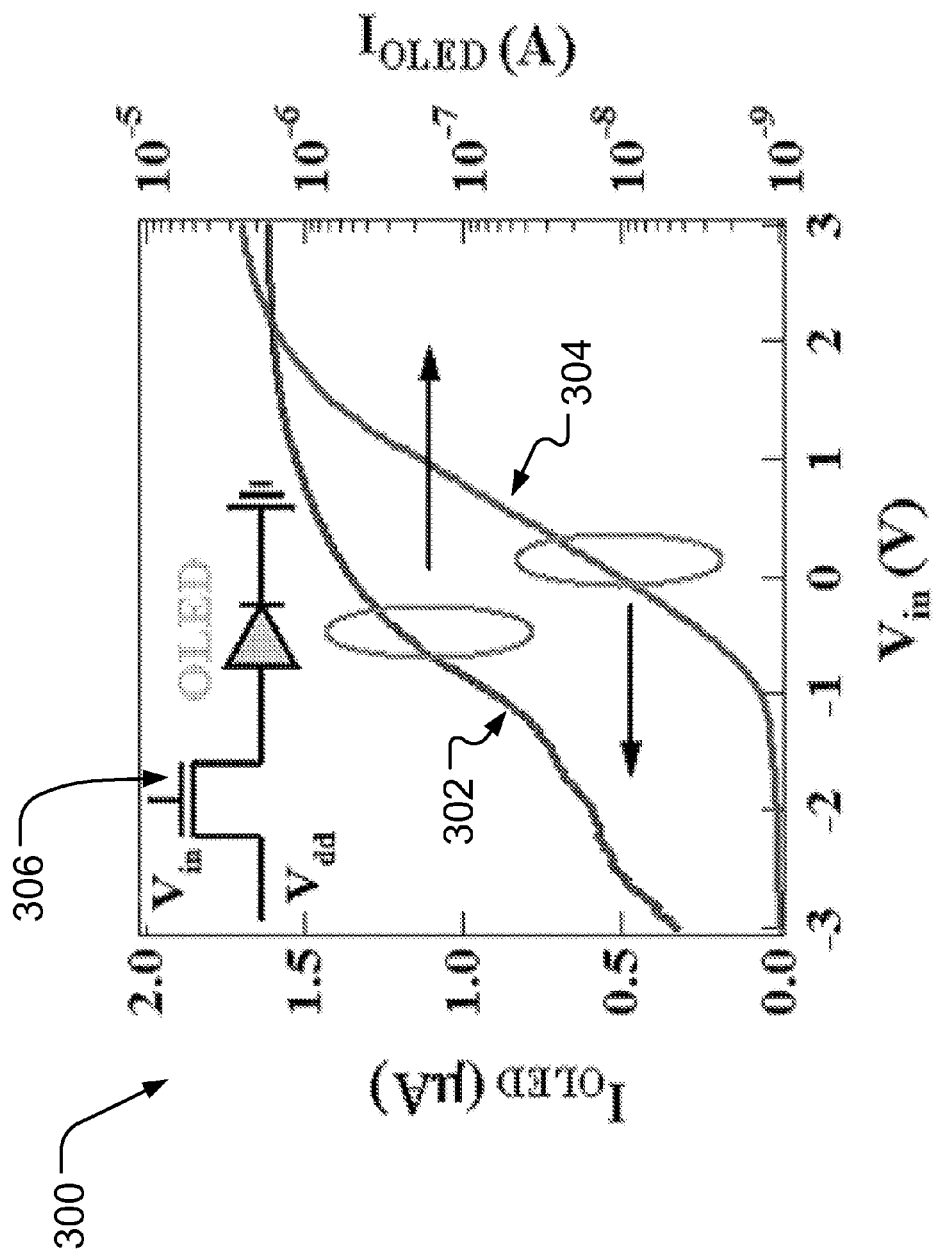
FIG. 3a shows a plot of the output current through the loaded OLED ($I_{OLED}$) versus $V_{in}$ with $V_{dd}$ at 5.0 V in linear scale (red line) and log scale (blue line), respectively.
Figure 3B:
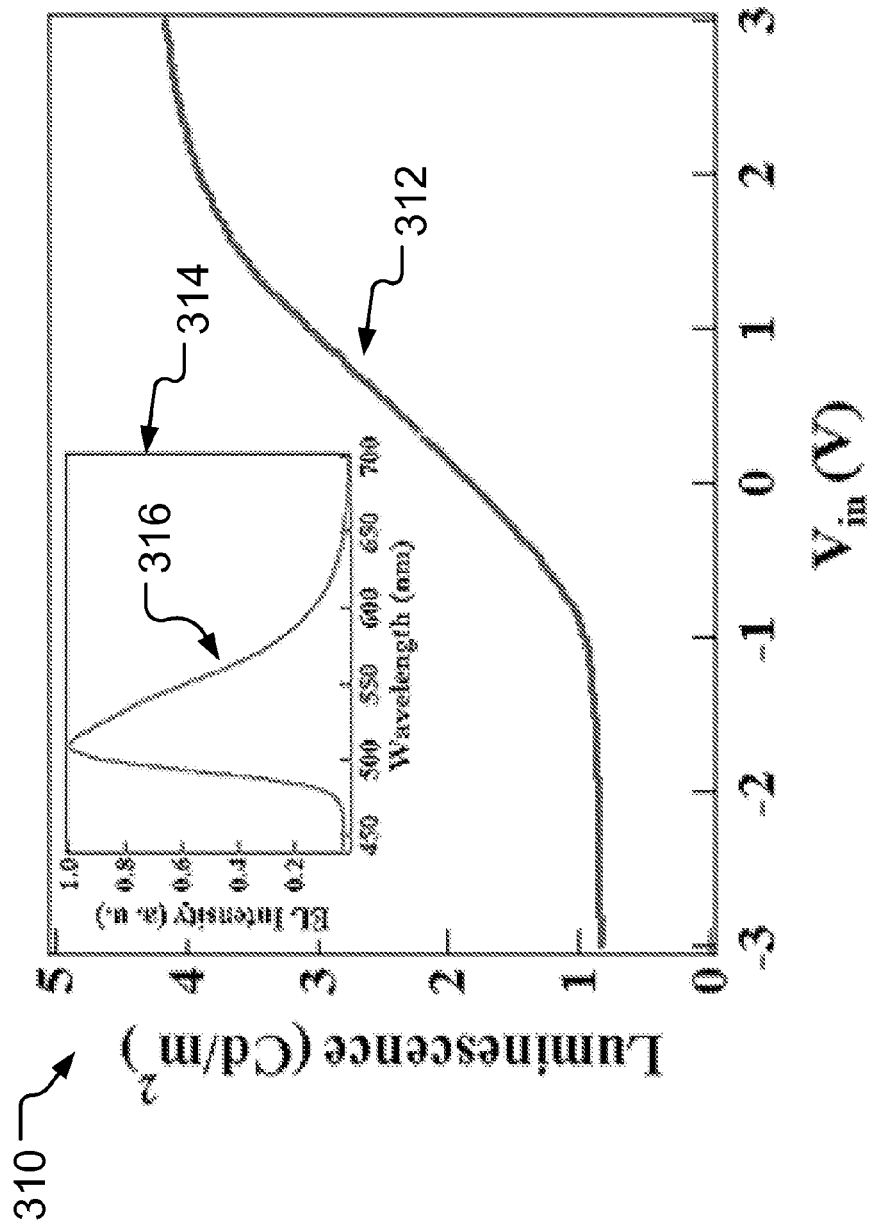
FIG. 3b shows OLED light intensity versus $V_{in}$ with $V_{dd}$=5.0 V. Inset: OLED spectrum.
Figure 3C:
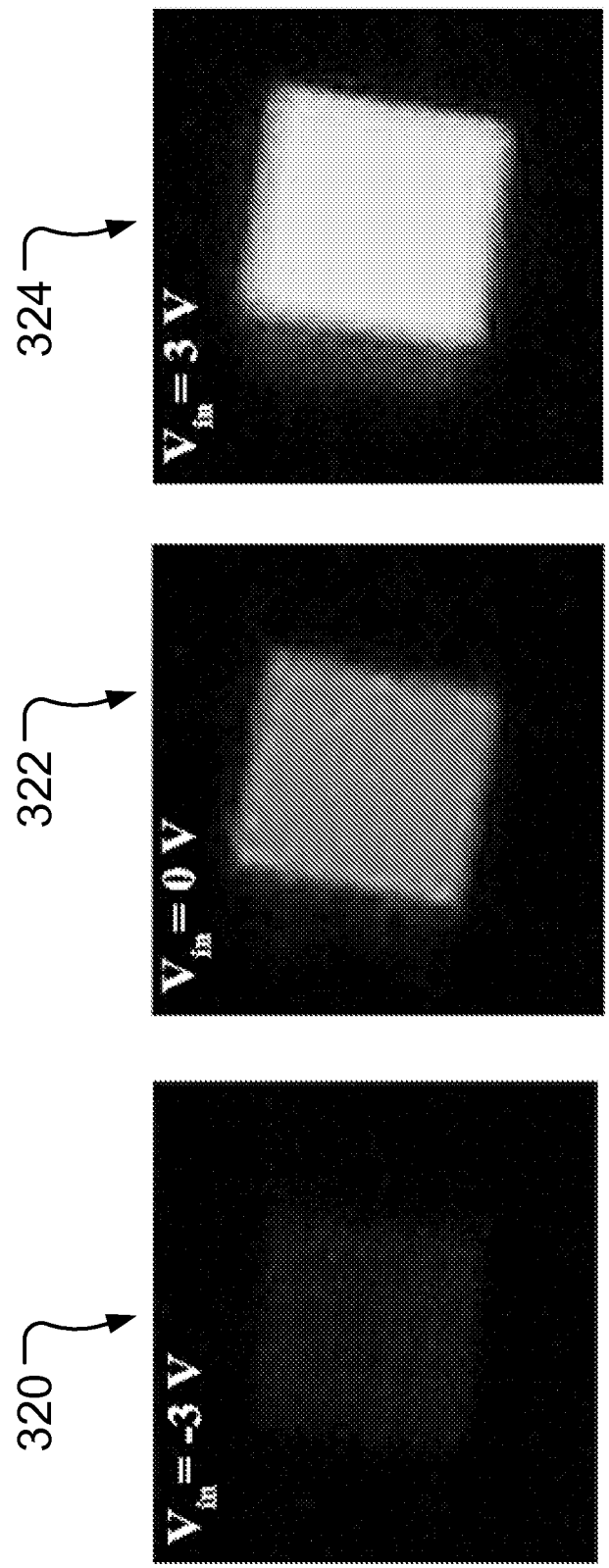
FIG. 3c shows optical images of the OLED under $V_{in}$=−3.0 V, 0.0 V, and 3.0 V.

The ability to fabricate high performance As-doped In$_2$O$_3$ nanowire TTFTs enables further exploration of transparent circuit applications. Controlling a variable-intensity OLED can be also implemented. For example, FIG. 3a shows a plot 300 of an output current through the loaded OLED ($I_{OLED}$) versus $V_{in}$ with $V_{dd}$ at 5.0 V in linear scale 302 and log scale 304, respectively. FIG. 3a shows that a monochrome OLED can be wire-bonded on a breadboard together with an As-doped In$_2$O$_3$ nanowire TTFT chip. The inset 306 of FIG. 3a shows a circuit diagram of the experimental setup, where one TTFT is connected to an external OLED, and $V_{dd}$ is applied to drain of the transistor. By controlling $V_{in}$ that provides a gate voltage for the transistor with fixed $V_{dd}$, the voltage drop across the OLED can be controlled. In FIG. 3a, the current flowing through the OLED is successfully modulated via $V_{in}$ by a factor of ~300, thus controlling the OLED light intensity, as shown in FIG. 3b. FIG. 3b is a plot 310 that shows the OLED light intensity versus $V_{in}$ (312) with $V_{dd}$=5.0 V. The inset 314 of FIG. 3b shows the OLED spectrum 316. OLED light intensity below 1 Cd/m$^2$ is usually defined as the off-state and above 1 Cd/m$^2$ as the on-state. Although the present off-state:on-state light intensity ratio is ~5, the effect is clearly visible in FIG. 3c where the OLED is operated with $V_{in}$=−3 (320), 0 (322), and 3 (324) V, respectively.

AMOLED Display and Drive Circuitry

Figure 4A:
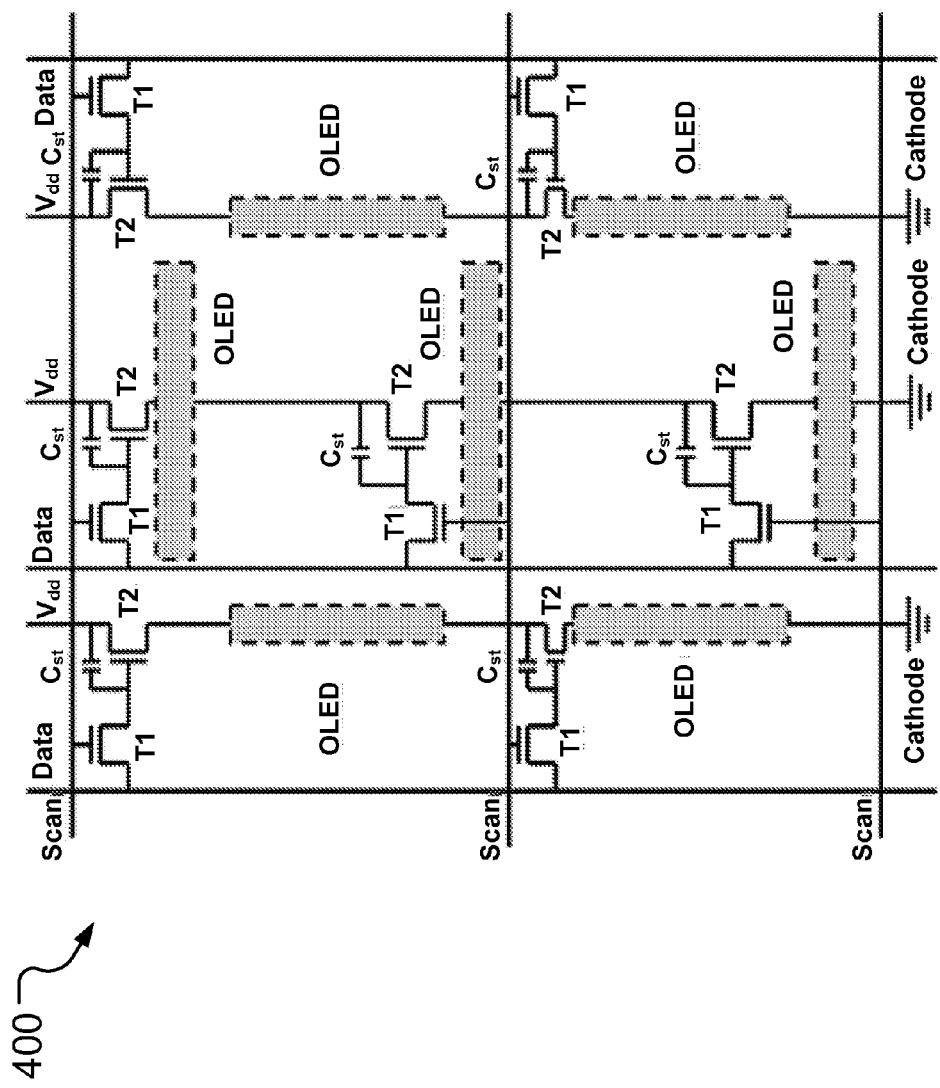
FIGS. 4a-c show applications of As-doped In2O3 nanowire TTFT circuitry to drive a seven segment AMOLED display.

The discussion above demonstrates the high-performance characteristics of As-doped In$_2$O$_3$ nanowire/SAND TTFTs, including high device mobility and fast device operation, can be employed as switching and driving transistors in an AMOLED display circuitry. In addition, described below is fabrication of an AMOLED display using high-performance As-doped In$_2$O$_3$ TTFTs. FIG. 4a shows an equivalent circuit diagram 400 of seven segment AMOLED display circuitry. Note that the driving circuit of each OLED pixel can consist of one switching transistor (T1), one driving transistor (T2), and one storage capacitor ($C_{st}$). T1 is employed to select a specified pixel and transfer data through the data line to the OLED. T2 is employed to control the current supplied to the OLED pixel, which is adjusted by controlling the $V_g$ of T2, equal to the voltage difference between the ends of $C_{st}$. The storage capacitor is employed to store data during one period for time-varying operations. The EL opening area of each segment is ~0.18 mm$^2$. In some implementations, the driving circuit of each OLED pixel can include additional components.

AMOLED display fabrication begins by patterning the OLED ITO anode and individually addressed bottom gate electrodes by photolithography and wet etching. Next, 50 nm ALD Al$_2$O$_3$ is deposited on the patterned ITO gate and OLED anodes. Following Al$_2$O$_3$ deposition, contact holes above the OLED anodes, as bottom gate electrode contacts for each pixel, are fabricated through a wet etching process. After that, a suspension of As-doped In$_2$O$_3$ nanowires in 2-propanol alcohol is dispersed on the device substrate. A thin layer of source and drain electrodes (20 nm Al) are then deposited bye-beam evaporation and patterned by lift-off. Following source and drain electrode patterning, a 200 nm thick SiO$_2$ layer is deposited by e-beam evaporation to passivate the device and planarize the nanowire transistors for OLED fabrication. The detail of OLED deposition can be found below.

Figure 4B:
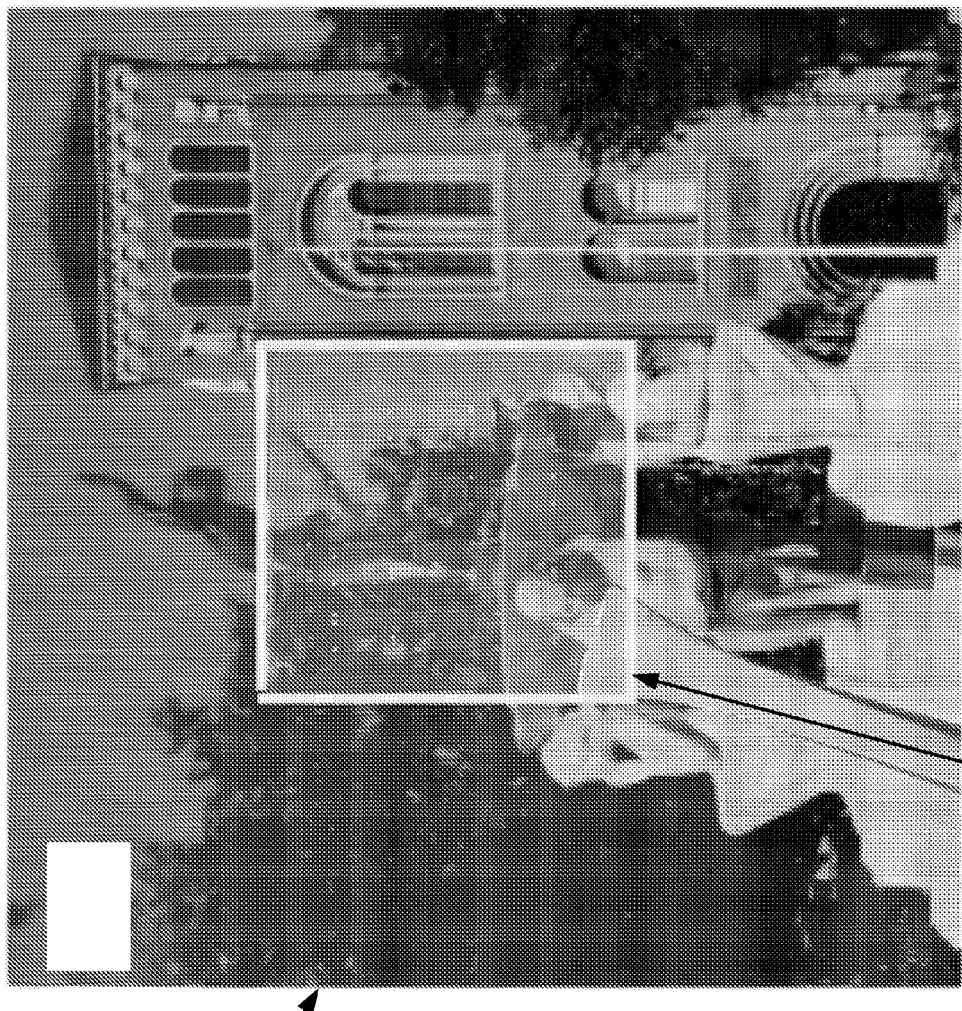
Figure 4C:
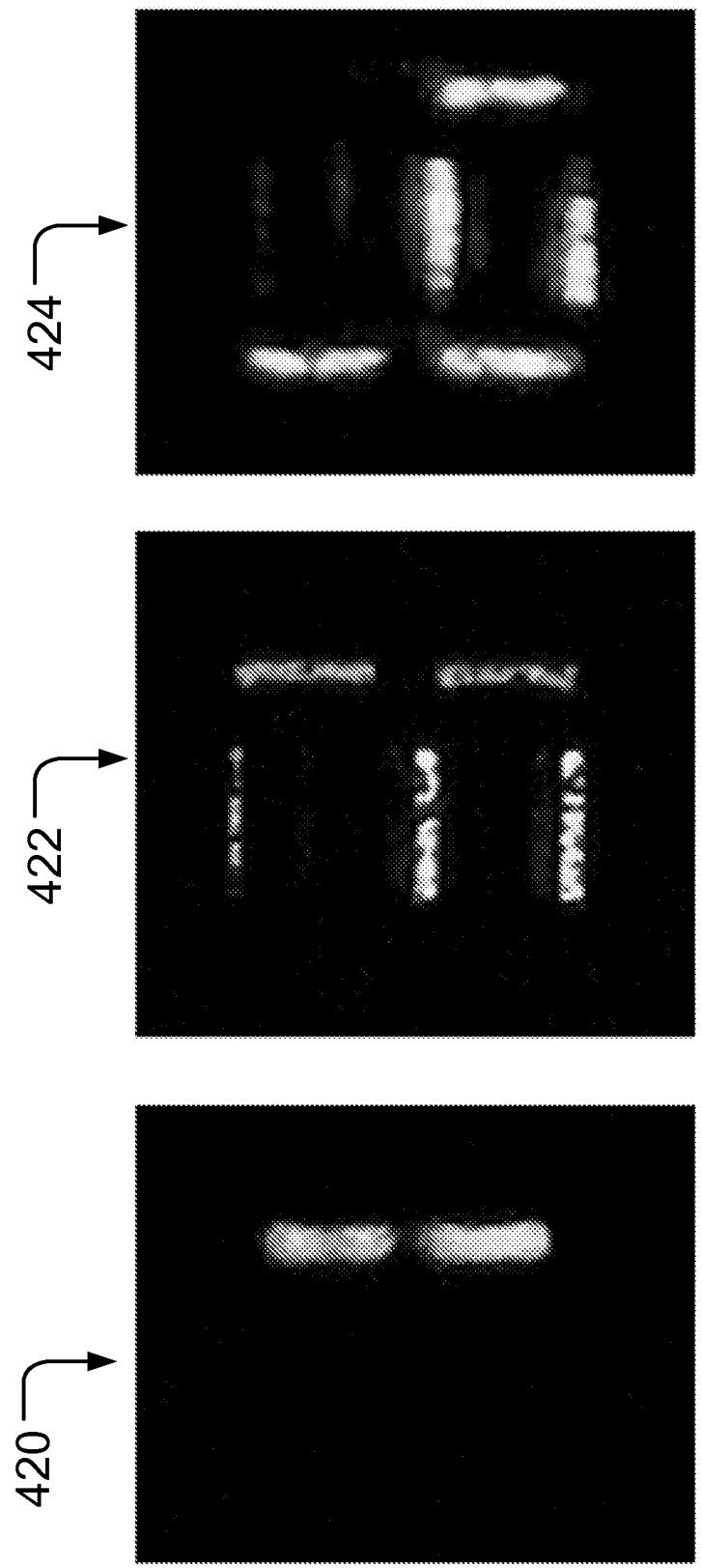

FIG. 4b shows an optical image 410 of a 1"×1" inch AMOLED display substrate before OLED deposition, with a background image 412 visible through the display region. The optical transmittance spectrum (see FIG. 7 below) reveals that the optical transmittance values of the AMOLED display before and after OLED layer deposition are ~81% and ~35% in the visible region, respectively. The optical transmittance should be readily increased using a more transparent OLED design. The display can consist of 12 seven-segment OLED pixels, 84 OLED unit pixels, and 156 nanowire TTFTs. In some implementations, additional components can be included. For each seven-segment OLED pixel, the scan lines for all unit pixels are individually controlled, as are the data lines. FIG. 4c shows optical images 420, 422 and 424 of the seven segment pixels with different numerical digits at different data line voltages ($V_{data}$=−5 to 5 V) with different scan line voltages ($V_{scan}$=−5 to 5 V) and fixed $V_{dd}$ (=3 V). This may be the first demonstration of a seven-segment AMOLED display driven entirely by TTFT circuits.

The great potential of As-doped $In_2O_3$ nanowires for high-performance transparent electronics has been described. With the aid of arsenic dopants and a self-assembled gate nanodielectric, As-doped $In_2O_3$ nanowire TTFTs with transparent ITO contacts show good transparency and excellent transistor performance such as high mobility, high on/off ratio, low operation voltage, and steep subthreshold slope. A saturation device mobility of 1,490 $cm^2V^{-1}s^{-1}$ is achieved on glass substrates, which is the highest TTFT device mobility reported so far. Additionally, the AC gain from a single As-doped $In_2O_3$ nanowire TTFT has been examined, and the results indicate good frequency response and a unity-gain frequency of 18.8 GHz. In addition, the TTFTs can be utilized to construct a transparent circuit and used to control a variable-intensity OLED. Moreover, an AMOLED display with good transparency can be also fabricated which generates numerical displays. Our results suggest that As-doped $In_2O_3$ nanowires have great potential to serve as building blocks for future transparent electronics.

As-doped $In_2O_3$ Nanowire Synthesis

Figure 5:
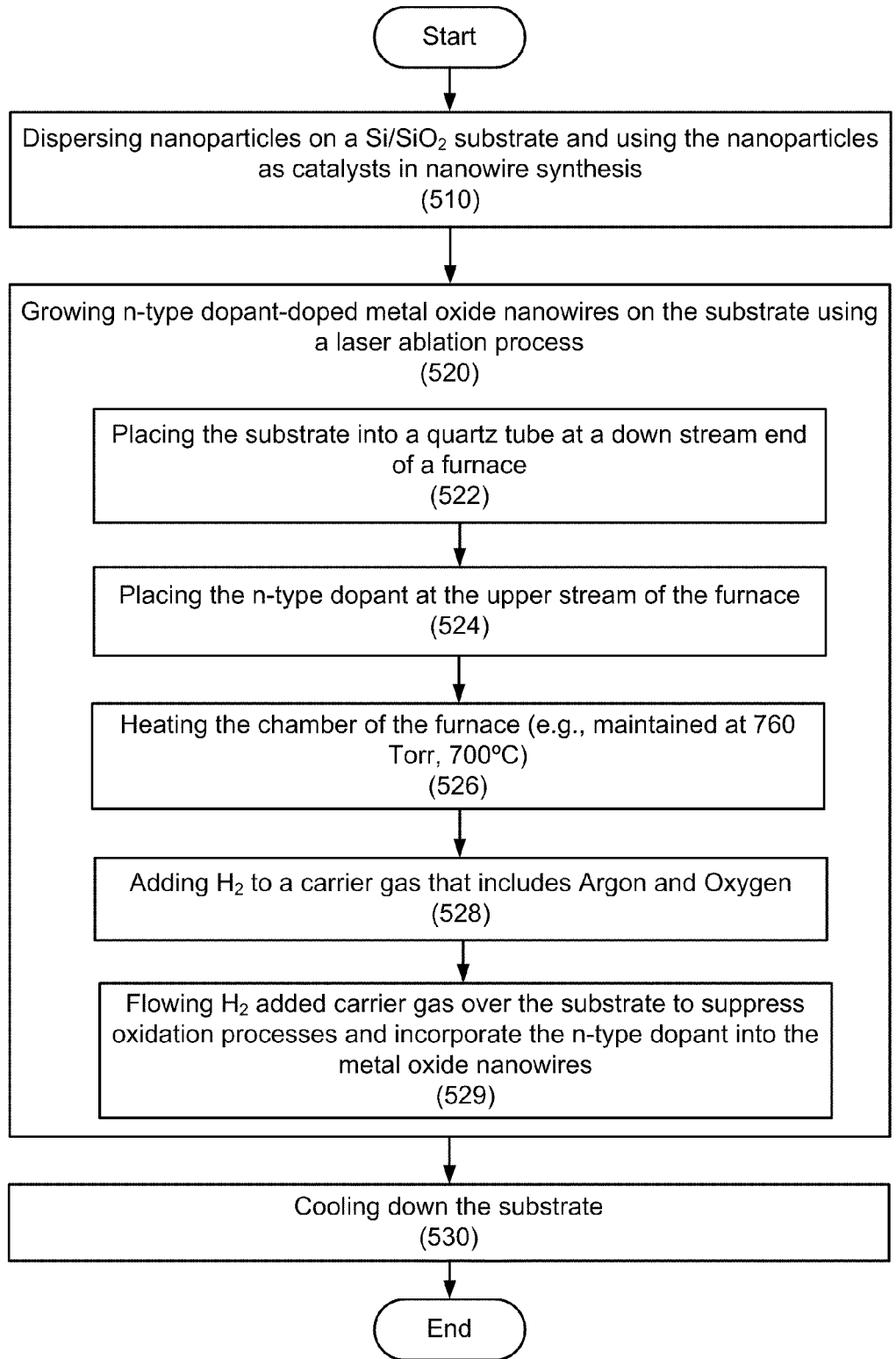
FIG. 5 is a process flow diagram showing a process of synthesizing As-doped $In_2O_3$.

FIG. 5 is a process flow diagram showing a process 500 of synthesizing As-doped $In_2O_3$. 10 nm gold nanoparticles can be dispersed on a $Si/SiO_2$ substrate and utilized as catalysts in the nanowire synthesis (510). n-type dopant-doped metal oxide nanowires can be grown on the substrate using a laser ablation process (520). The laser ablation process can include: placing the nanoparticles dispersed substrate into a quartz tube at the down stream end of a furnace (522); placing an InAs target at the upper stream of the furnace (524). During the laser ablation process, the chamber of the furnace is heated (526). For example, the chamber can be maintained at 760 Torr, 700° C. To a carrier gas that includes argon (Ar) and oxygen ($O_2$), $H_2$ can be added (e.g., 10% $H_2$) (528), and the $H_2$ added carrier gas can be flowed over the substrate to suppress oxidation processes and incorporate the n-type dopant into the metal oxide nanowires (529). For example, a constant flow of 150 standard cubic centimeters (sccm) of the carrier gas can be flowed over the substrate. The typical reaction time is about 50 minutes. After cooling down (530), the samples can be characterized using FESEM, TEM, XRD and EDS.

Figure 6:
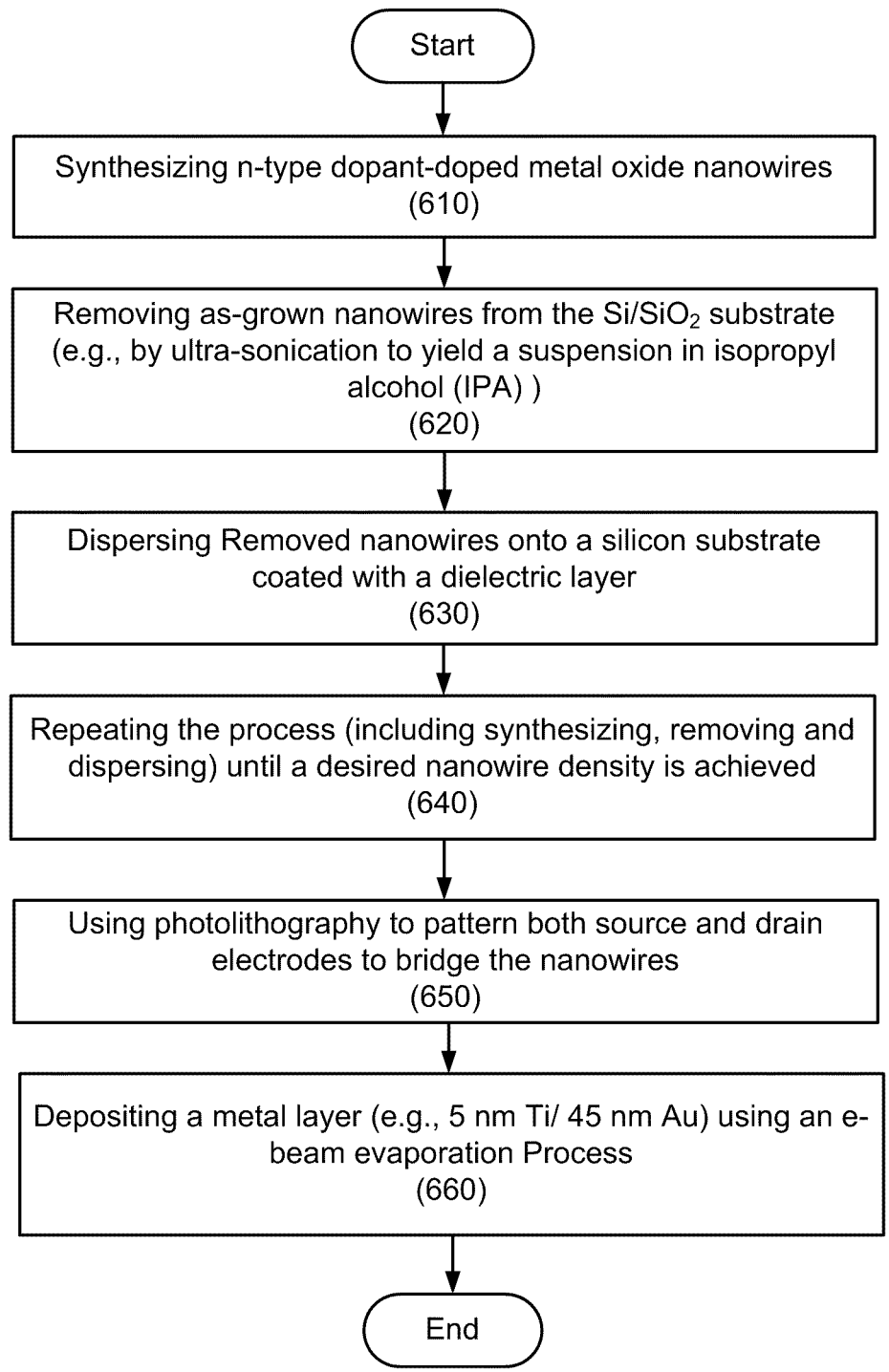
FIG. 6 is a process flow diagram of a process for fabricating As-doped $In_2O_3$ nanowire transistors with a SAND dielectric.

The Fabrication of As-doped $In_2O_3$ Nanowire Transistors with a SAND Dielectric FIG. 6 is a process flow diagram of a process 600 for fabricating As-doped $In_2O_3$ nanowire transistors with a SAND dielectric. After the n-type dopant-doped metal oxide nanowire synthesis (610), the as-grown nanowires can be removed from the $Si/SiO_2$ substrates by ultra-sonication to yield a suspension in isopropyl alcohol (IPA) (620), and can be then dispersed onto a silicon substrate coated with dielectric layer (e.g., SAND or ALD $Al_2O_3$) (630). The process can be performed repeatedly until the desired nanowire density is achieved (640). The nanowire orientation can be random, but the desired density can be achieved. A yield of at least 80% can be achieved for the transistors. The SAND dielectric films used can consist of layer-by-layer self-assembled multilayers deposited using procedures described in the Yoon et al. paper (see Yoon, M. Y.; Facchetti, A.; Marks, T. J., σ-π molecular dielectric multilayers for low low-voltage organic thin-film transistors. *Proceedings of the National Academy of Sciences* 2005, 102, (13), 4678-4682.) The SAND dielectric can be composed of self-assembled multilayers that include the following layer building blocks: (i) α,ω-difunctionalized hydrocarbon chains that block charge transport due to their saturated structures, (ii) highly polarizable stilbazolium π-electron layers that stabilize charge carriers in the channel with oriented dipoles, and (iii) glassy siloxane polymer layers that planarize the surface and enhance structural robustness by cross-linking and filling pinholes. Next, photolithography can be applied to pattern both source and drain electrodes to bridge the nanowires (650), followed by metal deposition of 5 nm Ti/45 nm Au using an e-beam evaporation (660). The degenerately doped silicon substrate can serve as the back gate. The mobility of a single As-doped $In_2O_3$ nanowire TFT is enhanced to ~2,560 $cm^2V^{-1}$ $sec^{-1}$, for $V_g$=4.4 V and $V_{DS}$=200 mV. In addition, $I_{on}$ can be increased to 160 µA at $V_g$=3.0 V and $V_{DS}$=1.5 V, and S increased to 149 mV/dec.

Figure 7A:
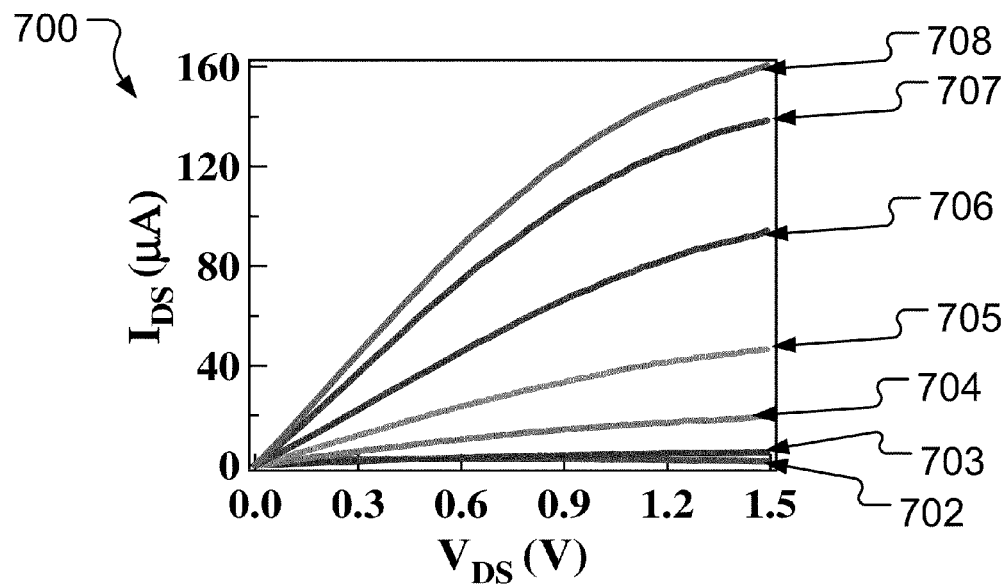
FIG. 7a represents the Family of $I_{ds}$-$V_{DS}$ curves for a single As-doped $In_2O_3$ nanowire transistor using SAND as the dielectric layer with a channel length of 1.8 μm.
Figure 7B:
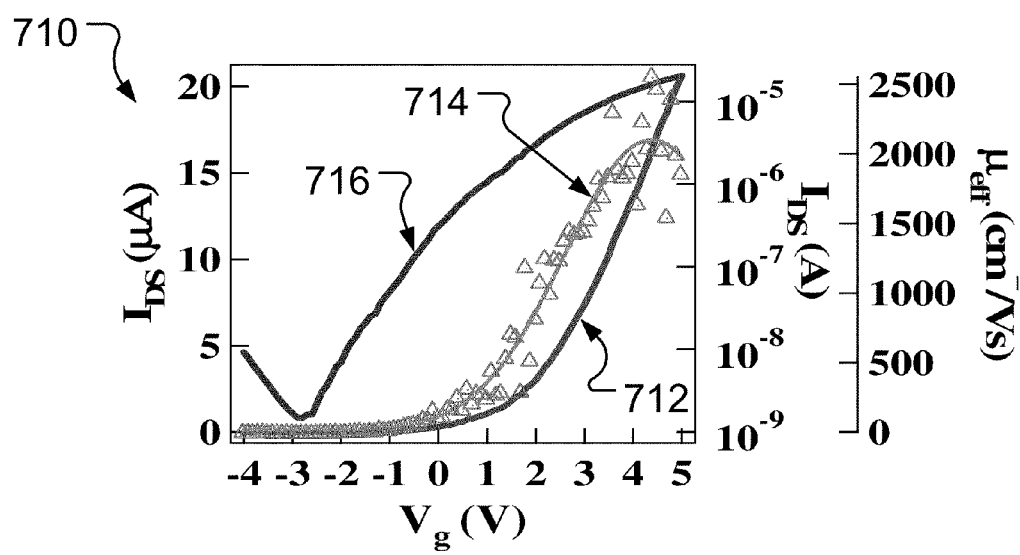
FIG. 7b shows the current versus gate voltage ($I_{ds}$-$V_g$) curves in the linear region ($V_{DS}$=200 mV).

FIG. 7a (5a) is a plot 700(500) that shows a family of $I_{ds}$-$V_{DS}$ curves 702, 703, 704, 705, 706, 707 and 708 for a single As-doped $In_2O_3$ nanowire transistor using SAND as the dielectric layer with a channel length of 1.8 µm. The gate voltage is varied from −2.0 V to 4.0 V in steps of 1.0 V from the bottom to top (702, 703, 704, 705, 706, 707 and 708). FIG. 7b is a plot 710 that shows the current versus gate voltage ($I_{ds}$-$V_g$) curves in the linear region ($V_{DS}$=200 mV). Curves 712, 714 and 716 correspond to a linear-scale $I_{ds}$-$V_g$, log scale $I_{ds}$-$V_g$, and µ, respectively.

Figure 8:
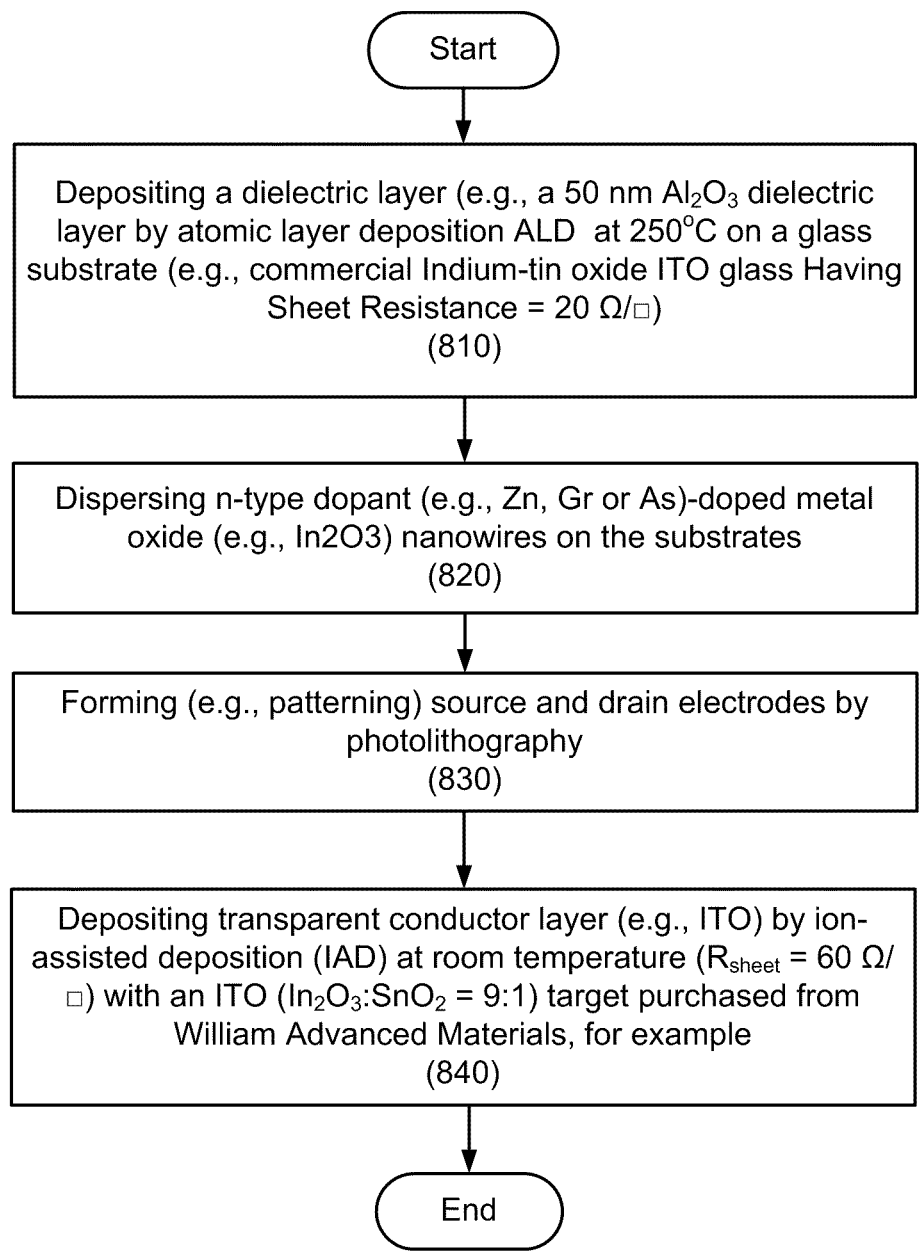
FIG. 8 is a process flow diagram of a process for fabricating As-doped $In_2O_3$ nanowire TTFTs with an $Al_2O_3$ dielectric.

The Fabrication of As-doped $In_2O_3$ Nanowire TTFTs with an $Al_2O_3$ Dielectric FIG. 8 is a process flow diagram of a process 800 for fabricating As-doped $In_2O_3$ nanowire TTFTs with an $Al_2O_3$ dielectric. For transparent nanowire transistors, fabrication can be started with the deposition of a 50 nm $Al_2O_3$ dielectric layer by atomic layer deposition (ALD) on a commercial ITO glass (Sheet Resistance=20Ω/□) at 250° C. (810). The ITO glass can serve as the back gate of the transparent transistors. The As-doped $In_2O_3$ nanowires can be then dispersed on the substrates as described above (820). After forming (e.g., patterning) source and drain electrodes by photolithography (830), a transparent conductor layer (e.g., ITO) can be deposited by ion-assisted deposition (IAD) at room temperature ($R_{sheet}$=60Ω/□) with an ITO ($In_2O_3$:$SnO_2$=9:1) target purchased from William Advanced Materials, for example (840). The schematic diagram is shown in FIG. 2a above, inset. Next, the electronic parameters of as-fabricated nanowire TTFTs can be examined by using Agilent 4156B instrumentation, for example.

Figure 9A:
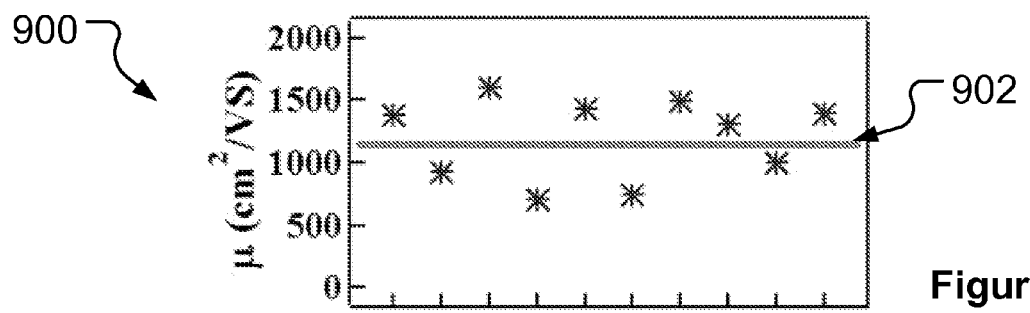
FIGS. 9a, 9b and 9c show device mobility, subthreshold voltage, and $I_{on}/I_{off}$ ratio of 10 single nanowire TTFTs, with the straight lines indicating average values for the respective parameters.
Figure 9B:
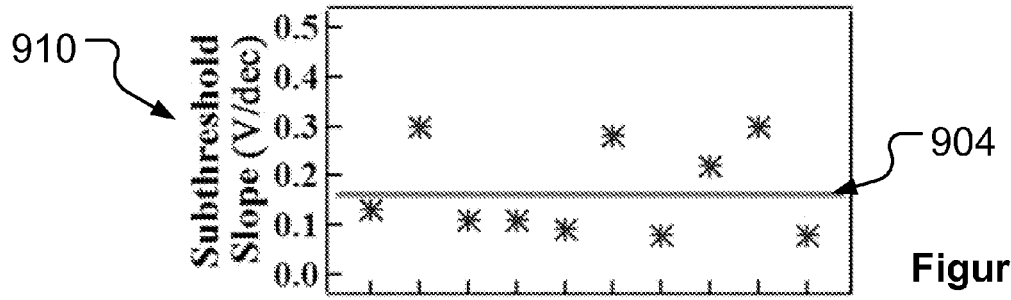
Figure 9C:
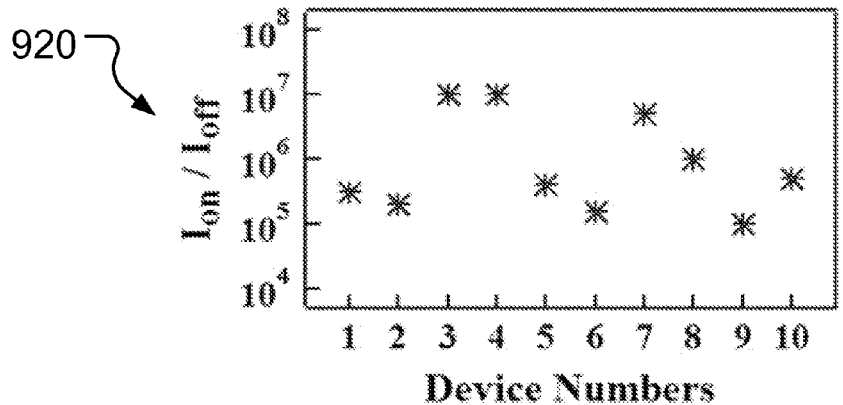

FIGS. 9a (6a), 9b and 9c show the device mobility 900, subthreshold voltage 910, and $I_{on}/I_{off}$ ratio 920 of 10 single As-doped $In_2O_3$ nanowire TTFTs. The straight lines 902 and 904 indicate corresponding average values. The device mobility is 1,200 $cm^2V^{-1}$ $sec^{-1}$ in average with a standard deviation of 210 $cm^2V^{-1}$ $sec^{-1}$, the subthreshold voltage is 170 m/dec with a standard deviation of 90 mV/dec, and the $I_{on}/I_{off}$ ratio is from $10^5$ to $10^7$.

OLED Depositions for the AMOLED Display

Figure 10:
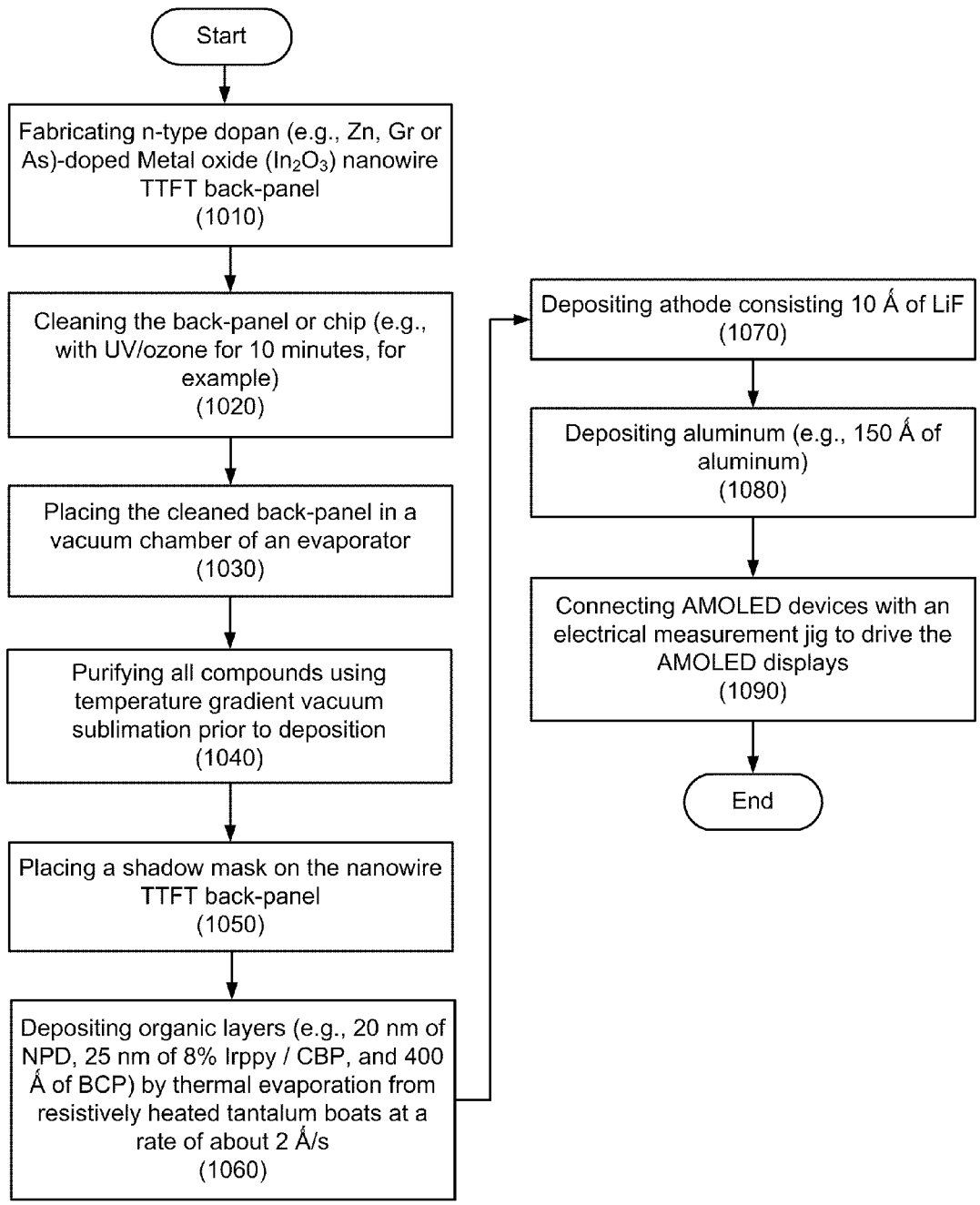
FIG. 10 is a process flow diagram of a process for OLED depositions for AMOLED display.
Figure 11:
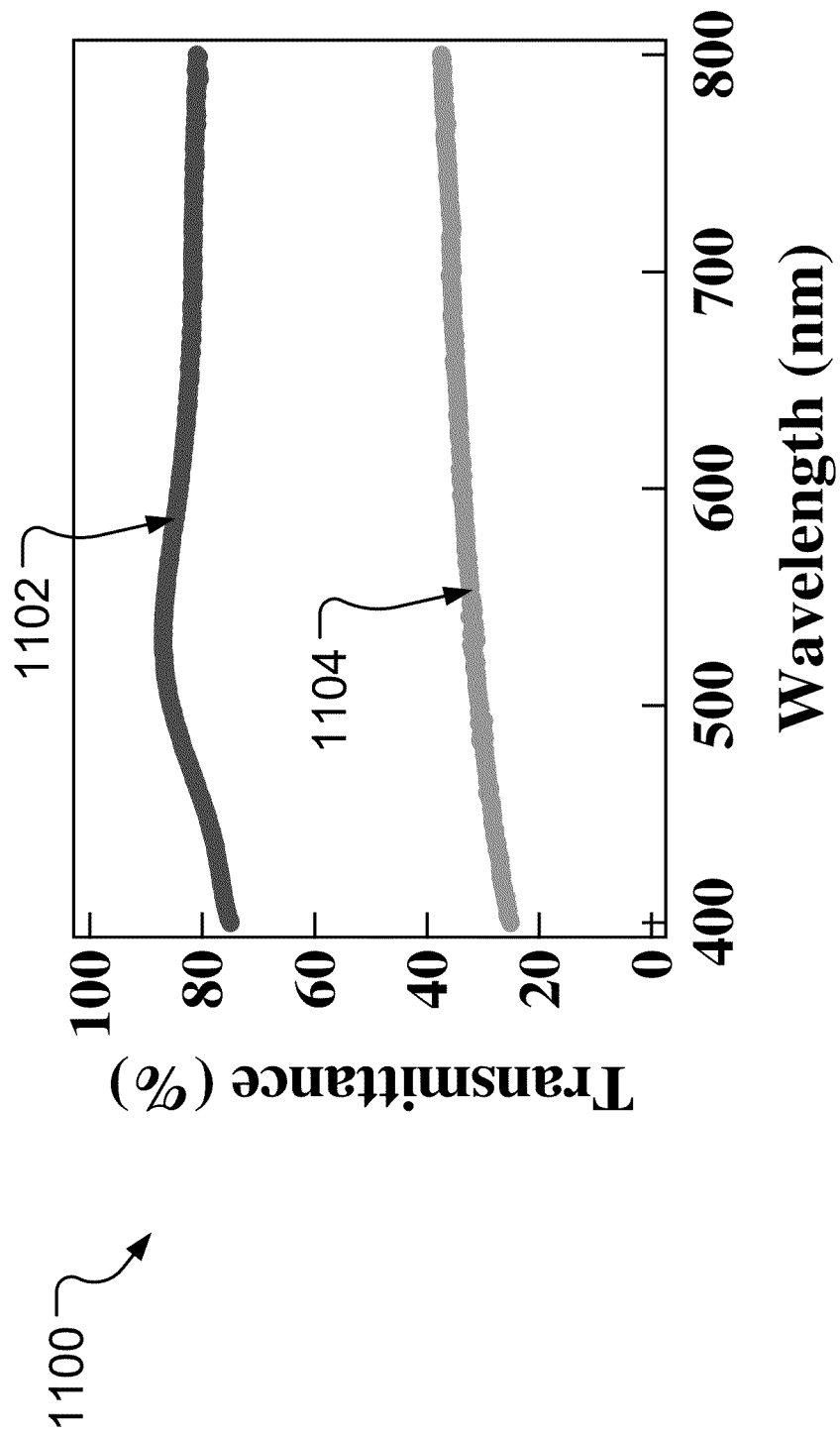
FIG. 11 shows optical transmission spectra of a typical As-doped $In_2O_3$ nanowire TTFT, and an AMOLED display substrate after transparent OLED deposition.

FIG. 10 is a process flow diagram of a process 1000 for OLED depositions for AMOLED display. After the fabrication of the As-doped $In_2O_3$ nanowire TTFT back-panel (1010), the back-panel or chip can be cleaned with UV/ozone for 10 minutes, for example (1020). The cleaned back-panel can be then placed in the vacuum chamber of an evaporator (1030). All compounds can be purified using temperature gradient vacuum sublimation prior to deposition (1040). A shadow mask can be placed on the nanowire TTFT back-panel (1050), after which organic layers (20 nm of NPD, 25 nm of 8% Irppy/CBP, and 400 Å of BCP) can be deposited by thermal evaporation from resistively heated tantalum boats at a rate of about 2 Å/s (1060), followed by the cathode consisting 10 Å of LiF (1070) and 150 Å of aluminum (1080). The AMOLED devices can be then connected with a home-made electrical measurement jig to drive the AMOLED displays (1090). The transmittance spectrum reveals ~81% optical transmission of As-doped $In_2O_3$ nanowire TTFT, essentially identical to that of bare glass or glass/ITO substrates. After OLED layer deposition, the transmittance spectrum of AMOLED display is about 35% optical transmission. FIG. 11(7) is a plot 1100 showing an optical transmission spectra of a typical As-doped $In_2O_3$ nanowire TTFT (curve 1102), and a AMOLED display substrates after transparent OLED deposition (curve 1104).

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, the separation of various system components in the embodiments described above should not be understood as requiring such separation in all embodiments.

Only a few implementations and examples are described and other implementations, enhancements and variations can be made based on what is described and illustrated in this application.

What is claimed is:

1. A method of fabricating n-type dopant-doped metal oxide nanowires, comprising:
    dispersing nanoparticle catalysts on a $Si/SiO_2$ substrate; and
    growing n-type dopant-doped metal oxide nanowires on the $Si/SiO_2$ substrate using a laser ablation process, comprising:
        placing n-type dopant at an upper stream of a furnace,
        placing the $Si/SiO_2$ substrate at a downstream end of the furnace,
        heating the furnace,
        adding hydrogen to a carrier gas comprising argon and oxygen,
        flowing the hydrogen-added carrier gas over the $Si/SiO_2$ substrate to suppress oxidation processes and incorporate the n-type dopant into the metal oxide nanowires, and
        cooling the n-type dopant-doped metal oxide nanowires grown on the $Si/SiO_2$ substrate.

2. The method of claim 1, wherein the n-type dopant is selected from the following comprising:
    zinc;
    antimony; and
    arsenic.

3. The method of claim 1, wherein the n-type dopant-doped metal oxide nanowires comprises:
    n-type dopant-doped indium oxide ($In_2O_3$) nanowires.

* * * * *